(12) United States Patent
Jang et al.

(10) Patent No.: US 8,581,825 B2
(45) Date of Patent: Nov. 12, 2013

(54) DRIVING CIRCUIT INCLUDING SHIFT REGISTER AND FLAT PANEL DISPLAY DEVICE USING THE SAME

(75) Inventors: Yong-Ho Jang, Gyeonggido (KR); Soo-Young Yoon, Gyeonggido (KR); Nam-Wook Cho, Gyeonggido (KR)

(73) Assignee: LG Display Co., Ltd., Seoul (KR)

( * ) Notice: Subject to any disclaimer, the term of this patent is extended or adjusted under 35 U.S.C. 154(b) by 62 days.

(21) Appl. No.: 13/223,875

(22) Filed: Sep. 1, 2011

(65) Prior Publication Data

US 2011/0310000 A1 Dec. 22, 2011

Related U.S. Application Data

(62) Division of application No. 11/167,192, filed on Jun. 28, 2005, now Pat. No. 8,031,158.

(30) Foreign Application Priority Data

Jun. 29, 2004 (KR) .............................. 2004-0049526

(51) Int. Cl.
*G09G 3/36* (2006.01)

(52) U.S. Cl.
USPC ........................................................ 345/100

(58) Field of Classification Search
USPC ................................ 345/100, 204; 377/64–81
See application file for complete search history.

(56) References Cited

U.S. PATENT DOCUMENTS

| | | | |
|---|---|---|---|
| 4,746,915 A | 5/1988 | Sekiya | |
| 5,410,583 A | 4/1995 | Weisbrod et al. | |
| 5,859,630 A * | 1/1999 | Huq | 345/100 |
| 6,300,928 B1 * | 10/2001 | Kim | 345/92 |
| 6,429,836 B1 * | 8/2002 | Hansen | 345/74.1 |
| 6,670,944 B1 | 12/2003 | Ishii | |
| 6,831,625 B2 | 12/2004 | Matsushima et al. | |
| 6,845,140 B2 * | 1/2005 | Moon et al. | 377/78 |
| 7,038,653 B2 | 5/2006 | Moon | |
| 7,145,545 B2 | 12/2006 | Zebedee et al. | |
| 7,164,416 B1 * | 1/2007 | Fullman et al. | 345/204 |
| 2002/0150199 A1 | 10/2002 | Sasaki et al. | |
| 2003/0206608 A1 | 11/2003 | Kawahata et al. | |
| 2004/0104882 A1 * | 6/2004 | Kitani et al. | 345/100 |

\* cited by examiner

*Primary Examiner* — Sumati Lefkowitz
*Assistant Examiner* — Robert E Carter, III
(74) *Attorney, Agent, or Firm* — McKenna Long & Aldridge, LLP

(57) ABSTRACT

A driving circuit for a flat panel display device includes a generation unit for generating n-phase form generation clocks; and a plurality of shift register stages for sequentially generating a plurality gate signals to a plurality of gate lines using the n-phase form generation clocks, one of the shift register stage including first and second output terminals for outputting first and second switching signals, respectively, using an output signal of one of the preceding shift register stages and an output signal of one of the subsequent shift register stages; a first transistor connected to the first output terminal for receiving one of the n-phase form generation clocks; and a second transistor connected to the second output terminal and the first transistor, wherein each gate line is connected to a node between the first and second transistors.

14 Claims, 25 Drawing Sheets

US 8,581,825 B2

DRIVING CIRCUIT INCLUDING SHIFT REGISTER AND FLAT PANEL DISPLAY DEVICE USING THE SAME

CROSS-REFERENCE TO RELATED APPLICATIONS

This application is a Divisional of application Ser. No. 11/167,192 filed Jun. 28, 2005, now U.S. Pat. No. 8,031,158, which claims priority to Korean Patent Application No. 10-2004-0049526, filed Jun. 29, 2004, all of which are incorporated by reference in their entirety for all purposes as if fully set forth herein.

BACKGROUND OF THE INVENTION

1. Field of the Invention

The present invention relates to a display device and a method of driving a display device, and more particularly, to a liquid crystal display (LCD) device and a method of driving an LCD device.

2. Discussion of the Related Art

Cathode ray tubes (CRTs) are used for display devices such as televisions and monitors. However, CRTs have some drawbacks such as heavy weight, large volume and high driving voltage. Accordingly, flat panel display (FPD) devices having advantages of portability and low power consumption have been the subject of much recent research and development for the coming information era. Among the various types of FPD devices, liquid crystal display (LCD) devices and electroluminescent display (ELD) devices are widely used as monitors for notebook computers and desktop computers because of their high resolution, ability to display colors and superiority in displaying moving images.

In general, an LCD device includes two substrates facing each other. A liquid crystal layer is provided between the two substrates, each of which has a electrode. When a voltage is applied between the two electrodes, an electric field is generated. The electric field modulates the light transmittance of the liquid crystal layer by reorienting the liquid crystal molecules, thereby displaying images in the LCD device. On the other hand, an ELD device uses an electroluminescence phenomenon such that light is emitted when an electric field above a critical intensity is applied to a fluorescent material. The ELD device is classified into an inorganic type and an organic type according to source exciting carriers. An organic electroluminescent display (OELD) device is widely used because of its superiority in displaying full color images and moving images. In addition, the OELD device has advantages of wide viewing angle, high brightness and low driving voltage.

FPD devices such as LCD devices and OELD devices include a circuit unit converting RGB data and several control signals of an external driving system into proper electric signals, and a display panel displaying images using the electric signals. In general, the circuit unit, which includes a gate driver and a data driver, is formed on a substrate different from the display panel.

Recently, an active matrix type display panel where a plurality of pixel regions are disposed in a matrix configuration and a switching element such as a thin film transistor (TFT) is formed in each pixel region is widely used. The TFT is fabricated through repetition of photolithographic processes.

A part of a driving circuit may be formed at a periphery of the pixel region during the fabrication process of the TFT in the pixel region. In such a case, because the driving circuit is partially formed in the display panel without increasing the number of photolithographic processes, the fabrication cost can be reduced. Specifically, a gate driver having a relatively low driving frequency may be formed in the display panel with a high reliability.

FIG. 1 is a schematic plan view illustrating an active matrix type flat panel display device having a gate driver according to the related art.

As illustrated in FIG. 1, an active matrix type display device 10 includes a display panel 20 and a circuit unit 30 driving the display panel 20. The display panel 20 have a pixel array 22 including gate lines (not shown), data lines crossing the gate lines (not shown) to define a plurality of pixel regions, and a pixel TFT (not shown) connected to the corresponding gate and data lines, and a gate driver 24 including a plurality of driving TFTs connected to the gate lines. Because the plurality of driving TFTs are simultaneously formed with the pixel TFTs, an additional photolithographic process is not required. The circuit unit 30 includes a source circuit 32 generating several driving signals and a data driver 34 connected to the source circuit 32. The data driver 34 may be a tape carriage package (TCP) type where a driver integrated circuit (IC) 34a is formed on a flexible printed circuit (FPC).

FIG. 2 is a schematic block diagram illustrating the gate driver 24 of FIG. 1 according to the related art.

As illustrated in FIG. 2, the gate driver 24 includes a plurality of shift register stages "SRS1R," "SRS2R" and "SRS3R," and a clock line L supplying a clock to the plurality of shift register stages "SRS1R," "SRS2R" and "SRS3R." A plurality of gate lines "g1," "g2" and "g3" of the pixel array 22 (of FIG. 1) are connected to the output terminals of the plurality of shift register stages "SRS1R," "SRS2R" and "SRS3R," respectively, and the plurality of shift register stages "SRS1R," "SRS2R" and "SRS3R" sequentially supply output signals to the plurality of gate lines "g1," "g2" and "g3". Because each output terminal of the shift register stages is connected to an input terminal of the next shift register stage, the gate signal of each shift register stage is used as a start signal of the next shift register stage.

FIG. 3 is a timing chart showing output signals of the gate driver 24 according to the related art.

As shown in FIG. 3, the plurality of shift register stages "SRS1R," "SRS2R" and "SRS3R" (of FIG. 2) sequentially supply output signals "Vg1," "Vg2," and "Vg3" respectively to the plurality of gate lines "g1," "g2" and "g3" (of FIG. 2). Accordingly, a plurality of pixel TFTs connected to the plurality of gate lines "g1," "g2" and "g3," are sequentially turned on. The gate driver 24 according to the related art generates output signals having a simple shape (a square wave), and the shape of the output signals may not be modified.

FIG. 4 is a schematic circuit diagram illustrating a gate driver using two-phase clocks in a display panel for a flat panel display device according to the related art, and FIG. 5 is a schematic timing chart showing signals input to and output from the gate driver of FIG. 4.

As shown in FIG. 4, the gate driver includes a plurality of shift register stages "SRS1R," "SRS2R" and "SRS3R" using two-phase clocks "CLK1" and "CLK2". Each of the shift register stages "SRS1R," "SRS2R" and "SRS3R" includes a shift register unit "SRU1," "SRU2" or "SRU3," and first and second transistors "$T_1$" and "$T_2$" connected to each other in series and to the corresponding shift register unit. Output signals "Vg1," "Vg2" and "Vg3" are output from connection portions between the first and second transistors "$T_1$" and "$T_2$" to a plurality of gate lines "g1," "g2" and "g3" in a pixel array, respectively. In the first shift register stage "SRS1R," the first transistor "$T_1$" is connected to a first clock line "L1"

and the second transistor "T$_2$" is connected to a source voltage terminal (or a ground terminal). In the second shift register stage "SRS2R," the first transistor "T$_1$" is connected to a second clock line "L2" and the second transistor "T$_2$" is connected to a source voltage terminal (or a ground terminal). Similarly, the first transistors "T$_1$" of the plurality of shift register stages "SRS1R," "SRS2R" and "SRS3R" are alternately connected to the first and second clock lines "L1" and "L2", and the second transistors "T$_2$" of the plurality of shift register stages "SRS1R," "SRS2R" and "SRS3R" are connected to a source voltage terminal (or a ground terminal).

Gate terminals of the first and second transistors "T$_1$" and "T$_2$" are connected to Q terminal and Qb terminal of the corresponding shift register unit. When the Q terminal has a high state and the Qb terminal has a low state, the first transistor "T$_1$" is turned on and the second transistor "T$_2$" is turned off. Accordingly, each of the shift register stages "SRS1R," "SRS2R" and "SRS3R" outputs a corresponding clock signal of one of the first and second clock lines "L1" and "L2" connected to the first transistor "T$_1$" to the corresponding gate line "g1" "g2" or "g3."

As shown in FIG. 5, two-phase first and second clocks "CLK1" and "CLK2" of the first and second clock lines "L1" and "L2" alternate with each other. Because the Q1 terminal of the first shift register unit "SRU1" has a high state in response to a start signal and the second clock "CLK2," the first shift register stage "SRS1R" outputs the first clock "CLK1." When a shift register unit uses two-phase first and second clocks "CLK1" and "CLK2," a state of Q terminal may be changed from high to low by a clock signal such as the output signal of the previous stage or the next stage.

FIG. 6 is a schematic circuit diagram illustrating a gate driver using three-phase clocks in a display panel for a flat panel display device according to the related art, and FIG. 7 is a schematic timing chart showing signals input to and output from the gate driver of FIG. 6.

As illustrated in FIG. 6, the gate driver includes a plurality of shift register stages "SRS1R," "SRS2R" and "SRS3R" using three-phase clocks CLK1 to CLK3. Each of the shift register stages "SRS1R," "SRS2R" and "SRS3R" includes a shift register unit "SRU1," "SRU2" or "SRU3," and first and second transistors "T$_1$" and "T$_2$" connected to each other in series and to the corresponding shift register unit. Output signals "Vg1," "Vg2" and "Vg3" are output from connection portions between the first and second transistors "T$_1$" and "T$_2$" to a plurality of gate lines "g1," "g2" and "g3" in a pixel array, respectively. In the first shift register stage "SRS1R," the first transistor "T$_1$" is connected to a first clock line "L1" and the second transistor "T$_2$" is connected to a source voltage terminal (or a ground terminal). The first transistor "T$_1$" is connected to a second clock line "L2" and the second transistor "T$_2$" is connected to a source voltage terminal (or a ground terminal) in the second shift register stage "SRS2R"; and the first transistor "T$_1$" is connected to a third clock line "L3" and the second transistor "T$_2$" is connected to a source voltage terminal (or a ground terminal) in the third shift register stage "SRS3R." In this manner, the first transistors "T$_1$" of the plurality of shift register stages "SRS1R," "SRS2R" and "SRS3R" are alternately connected to the first, second and third clock lines "L1", "L2" and "L3", and the second transistors "T$_2$" of the plurality of shift register stages "SRS1R," "SRS2R" and "SRS3R" are connected to a source voltage terminal (or a ground terminal).

Gate terminals of the first and second transistors "T$_1$" and "T$_2$" are connected to Q terminal and Qb terminal of the corresponding shift register unit "SRU1," "SRU2" or "SRU3," respectively. When the Q terminal has a high state and the Qb terminal has a low state, the first transistor "T$_1$" is turned on and the second transistor "T$_2$" is turned off in the shift register stage. Accordingly, each of the shift register stages "SRS1R," "SRS2R" and "SRS3R" outputs a corresponding clock signal of one of the first, second and third clock lines "L1", "L2" and "L3" connected to the first transistor "T$_1$" to the corresponding gate line "g1," "g2" or "g3."

As shown in FIG. 7, the three-phase first, second and third clocks "CLK1," "CLK2" and "CLK3" of the first, second and third clock lines "L1", "L2" and "L3" alternately have a high state. Because the Q1 terminal of the first shift register unit "SRU1" has a high state in response to a start signal and the third clock "CLK3," the first shift register stage "SRS1R" outputs the first clock "CLK1." When the first shift register unit uses three-phase first, second and third clocks "CLK1," "CLK2" and "CLK3," a state of the Q1 terminal may be changed from high to low by the second clock "CLK2." Accordingly, the second clock "CLK2" is used as a disable signal of the first shift register unit "SRU1." When a shift register uses three-phase or greater clocks, the timing control of the Q terminal and Qb terminal for the state change between high and low becomes easier.

As discussed above, the shift registers according to the related art use two-phase, three-phase or four-phase clocks of a square wave shape. Accordingly, the output signals of the shift registers according to the related art have a simple shape. In addition, the shape of the output signals may not be modified once the related art shift registers are formed. Accordingly, a gate driver having a shift register according to the related art may not perform various functions. In order to perform various functions with the related art gate driver, a large number of thin film transistors are required, which reduces the reliability of the gate driver.

SUMMARY OF THE INVENTION

Accordingly, the present invention is directed to a display device and method of driving a display device that substantially obviates one or more of problems due to limitations and disadvantages of the related art.

An advantage of the present invention is to provide a driving circuit that sequentially outputs signals of various shapes and a flat panel display device including such a driving circuit.

Another advantage of the invention is to provide a method of driving a flat panel display device that sequentially outputs signals of various shapes.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a driving circuit for a flat panel display device includes a generation unit for generating n-phase form generation clocks; and a plurality of shift register stages for sequentially generating a plurality gate signals to a plurality of gate lines using the n-phase form generation clocks, one of the shift register stage including first and second output terminals for outputting first and second switching signals, respectively, using an output signal of one of the preceding shift register stages and an output signal of one of the subsequent shift register stages; a first transistor connected to the first output terminal for receiving one of the n-phase form generation clocks; and a second transistor connected to the second output terminal and the first transistor, wherein each gate line is connected to a node between the first and second transistors.

In another aspect, a flat panel display device includes a substrate having a display region and a non-display region at a periphery portion of the display region; a plurality of gate and data lines crossing each other to define a plurality of pixel regions in the display region on the substrate; a pixel transistor connected to each gate line; and a plurality of shift register stages in the non-display region for supplying a plurality of gate signals to the plurality of gate lines in response to n-phase form generation clocks.

In another aspect, a method of driving a flat panel display device includes supplying n-phase form generation clocks to a plurality of shift register stages; and supplying sequentially a plurality gate signals from the plurality of shift register stages to a plurality of gate lines using the n-phase form generation clocks, supplying one of the gate signals from the corresponding shift register stage to the corresponding gate line including outputting first and second switching signals to first and second transistors of the corresponding shift register stage using an output signal of one of the preceding shift register stages and an output signal of one of the subsequent shift register stages; and switching one of the n-phase form generation clocks with the first and second transistors.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, which are illustrated in the accompanying drawings. Wherever possible, similar reference numbers will be used throughout the drawings to refer to the same or like parts.

Figure 1:
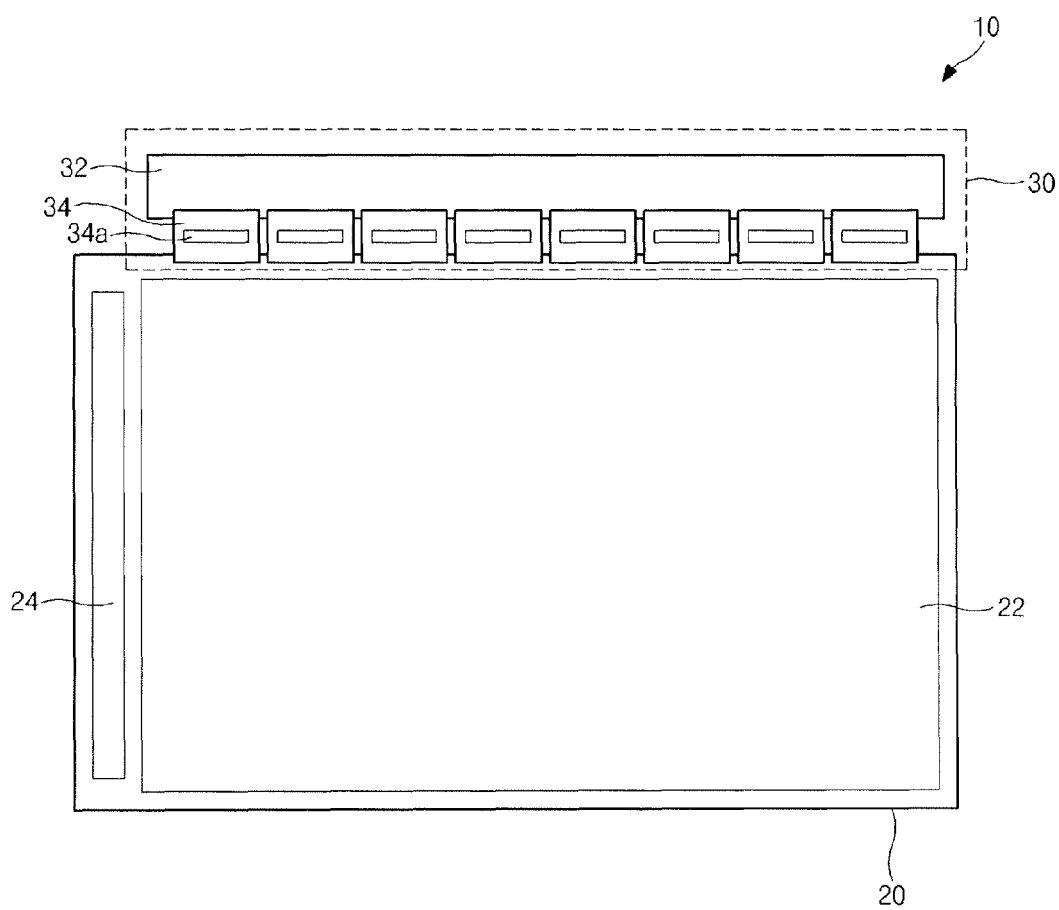
FIG. 1 is a schematic plan view illustrating an active matrix type flat panel display device having a gate driver according to the related art.
Figure 2:
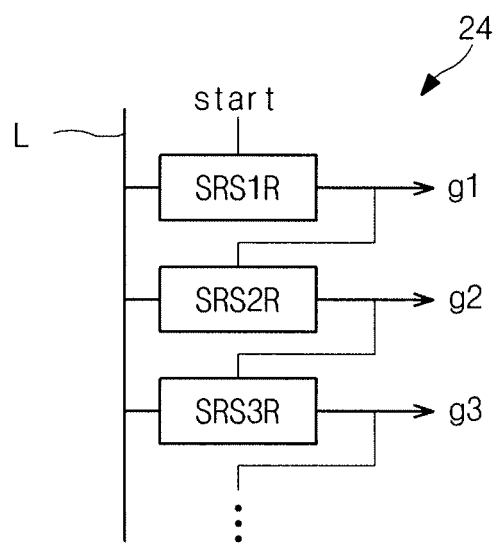
FIG. 2 is a schematic block diagram illustrating the gate driver 24 of FIG. 1 according to the related art.
Figure 3:
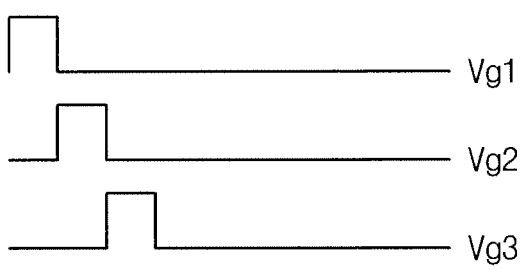
FIG. 3 is a timing chart showing output signals of the gate driver 24 according to the related art.
Figure 4:
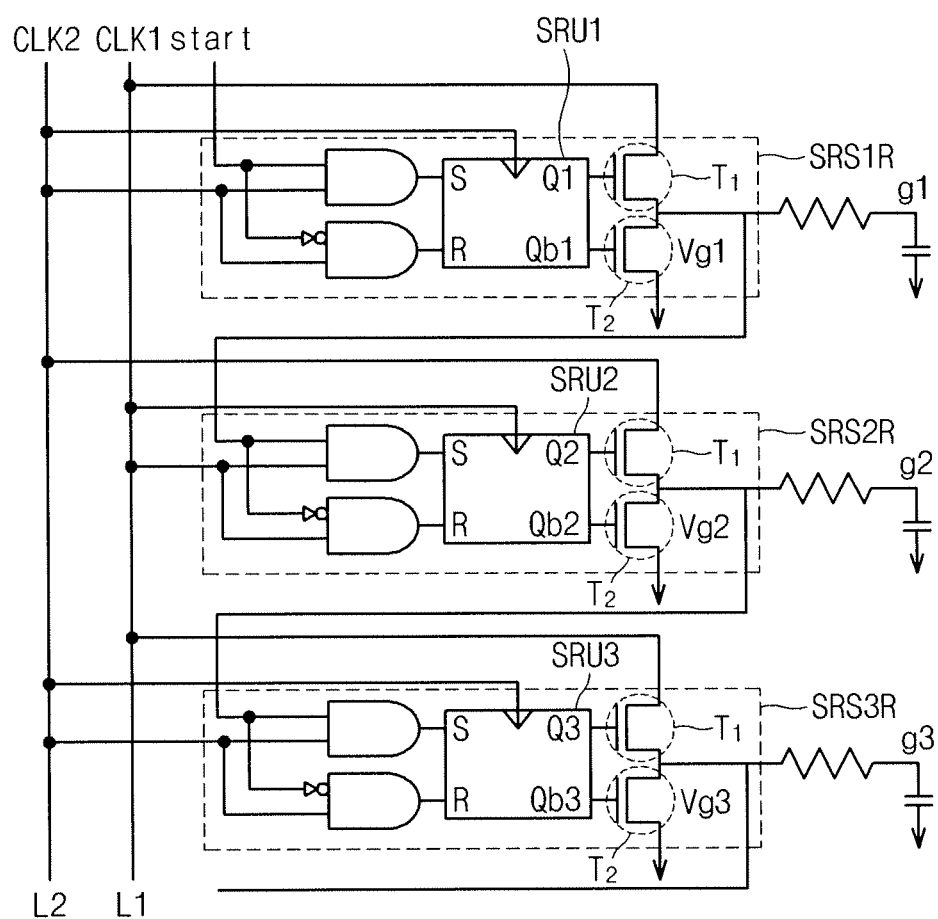
FIG. 4 is a schematic circuit diagram illustrating a gate driver using two-phase clocks in a display panel for a flat panel display device according to the related art.
Figure 5:
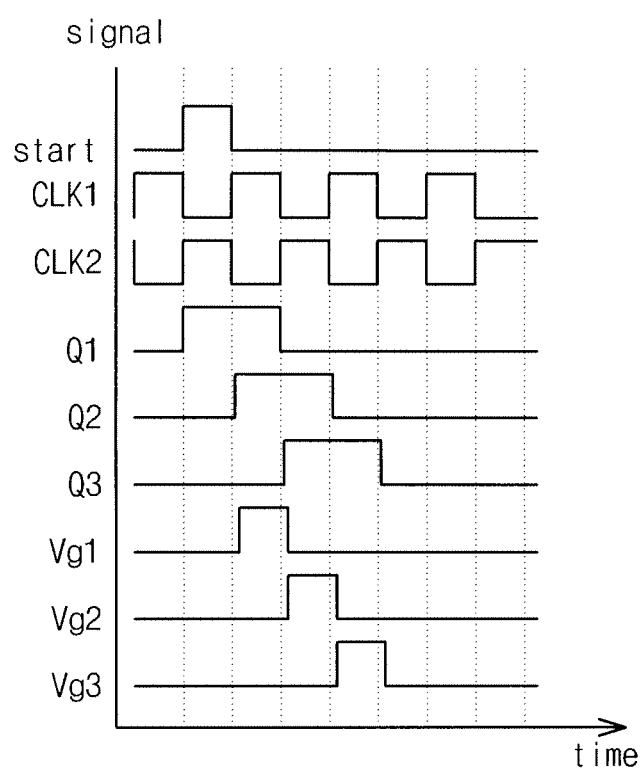
FIG. 5 is a schematic timing chart showing signals input to and output from the gate driver of FIG. 4.
Figure 6:
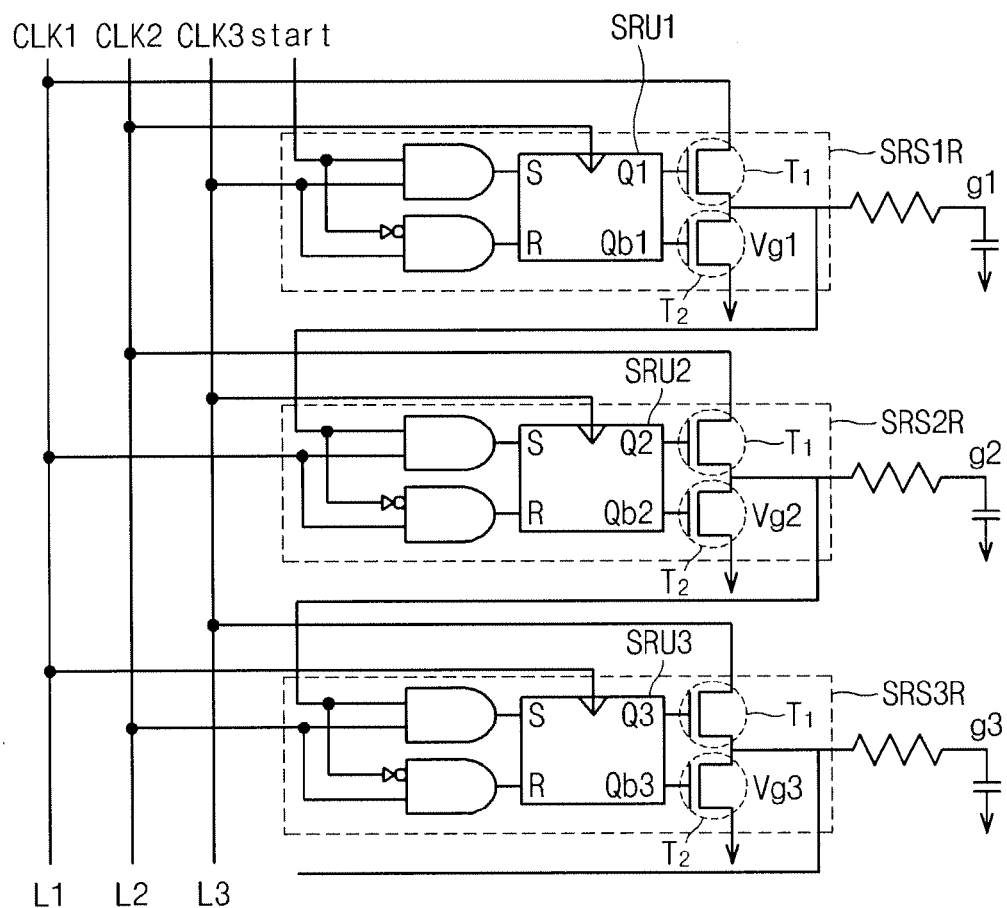
FIG. 6 is a schematic circuit diagram illustrating a gate driver using three-phase clocks in a display panel for a flat panel display device according to the related art.
Figure 7:
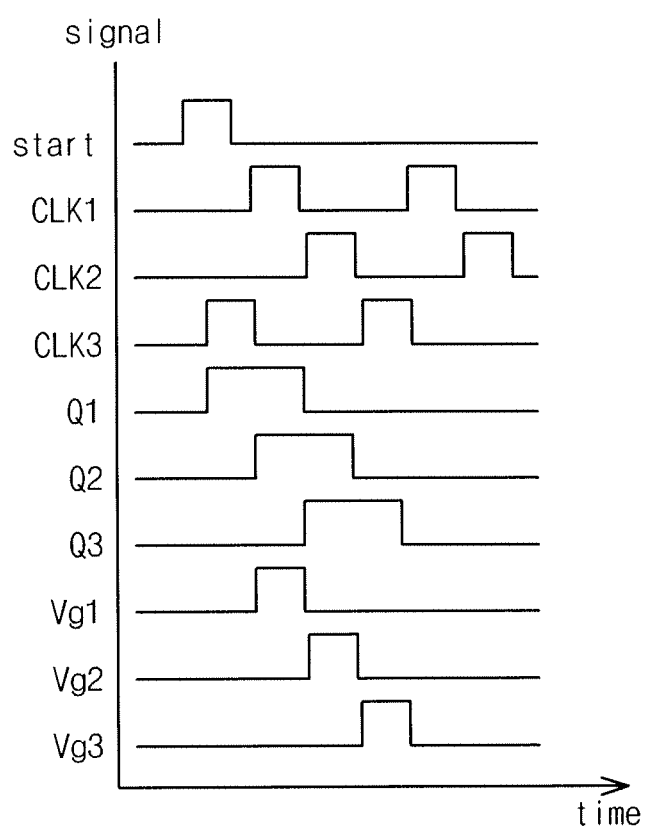
FIG. 7 is a schematic timing chart showing signals input to and output from the gate driver of FIG. 6.
Figure 8:
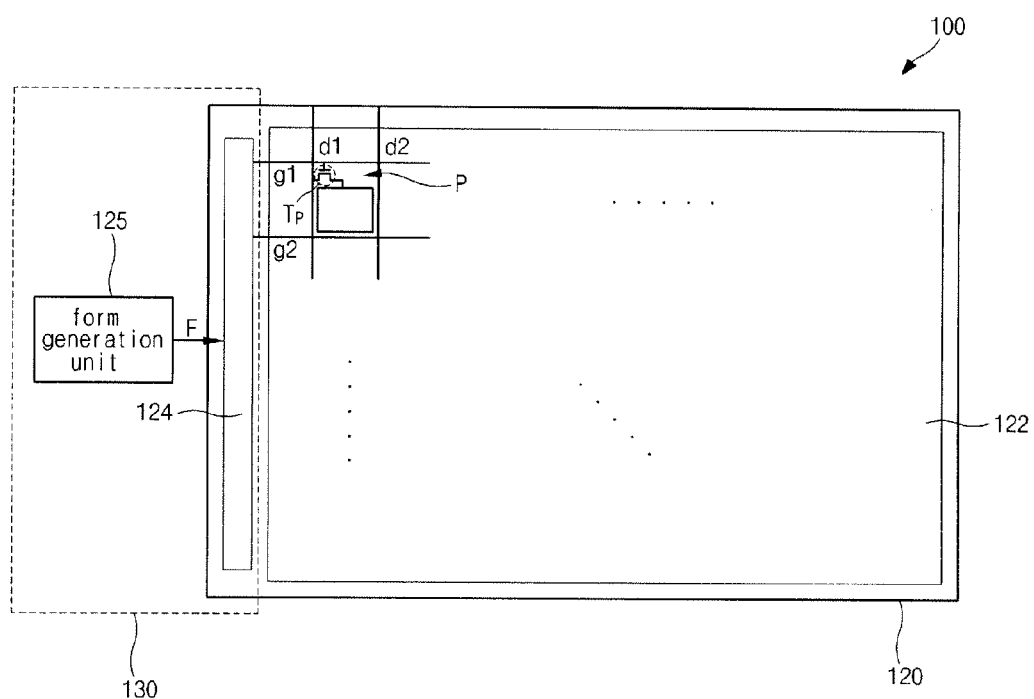
FIG. 8 is a schematic plan view illustrating an active matrix type flat panel display device having a gate driver according to the present invention.

FIG. 8 is a schematic plan view illustrating an active matrix type flat panel display device having a gate driver according to the present invention.

As illustrated in FIG. 8, an active matrix type display device 100 includes a display panel 120 having a display region and a non-display region at periphery portions of the display region, and a driving circuit 130 for driving the display panel 120. The display panel 120 have a pixel array 122 including gate lines "g1" and "g2", data lines "d1" and "d2" crossing the gate lines "g1" and "g2" to define a plurality of pixel regions "P" in the display region, and a pixel TFT "$T_p$" connected to the corresponding gate and data lines "g1", "g2", "d1" and "d2", and a gate driver 124 including a plurality of driving TFTs in the non-display region connected to the gate lines "g1" and "g2". Because the plurality of driving TFTs may be simultaneously formed with the pixel TFTs "$T_p$", an additional photolithographic process may be not required. The driving circuit 130 includes the gate driver 124, a source circuit (not shown) for generating several driving signals, a data driver (not shown) connected to the source circuit and the data lines "d1" and "d2" and form generation unit 125 for generating n-phase form generation clocks "F". As the display panel 120, a liquid crystal display panel, an organic electroluminescent display panel and so on may be used.

Figure 9:
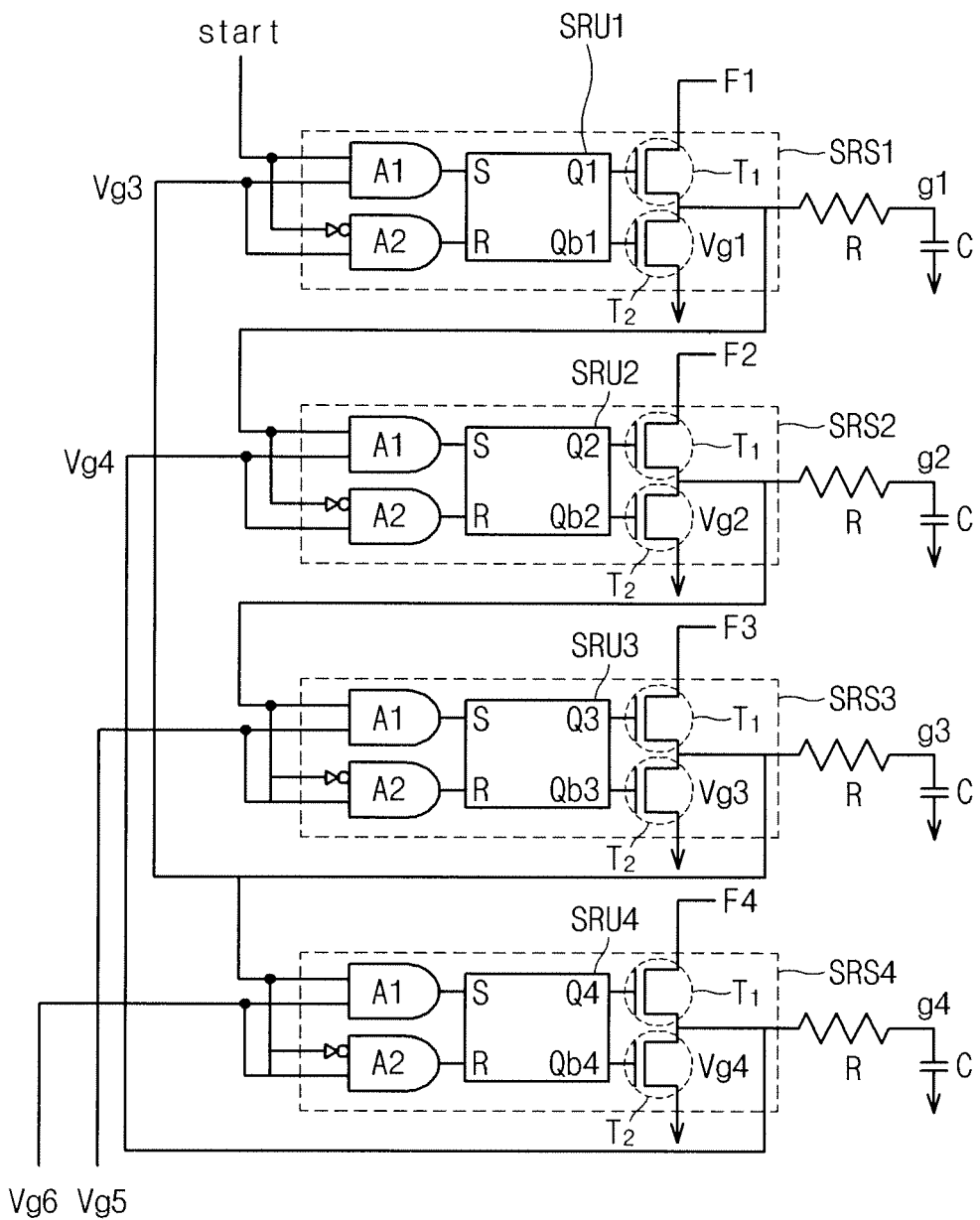
FIG. 9 is a schematic circuit diagram illustrating a driving circuit in a display panel for a flat panel display device according to a first embodiment of the present invention.

FIG. 9 is a schematic circuit diagram illustrating a driving circuit in a display panel for a flat panel display device according to a first embodiment of the present invention.

As illustrated in FIG. 9, the driving circuit includes a plurality of shift register stages "SRS1," "SRS2", "SRS3" and "SRS4". For the sake of brevity, only four shift register stages are shown and explained. Each of the shift register stages "SRS1," "SRS2", "SRS3" and "SRS4" includes a shift register unit "SRU1," "SRU2", "SRU3" or "SRU4", a first transistor "$T_1$" and a second transistor "$T_2$", and a first AND operator "A1" and a second AND operator "A2". An RS flip-flop circuit is used for the shift register units "SRU1," "SRU2", "SRU3" and "SRU4", and an AND gate circuit is used for the first and second operators "A1" and "A2". Each of the shift register stages "SRS1," "SRS2", "SRS3" and "SRS4" is connected to the corresponding gate line "g1", "g2", "g3" or "g4". An array resistor R and an array capacitor C connected to each of the gate lines "g1", "g2", "g3" and "g4" represent, respectively, a resistance and a capacitance of each of the gate lines "g1", "g2", "g3" and "g4" and a plurality of array pixels connected to the corresponding gate line "g1", "g2", "g3" and "g4".

For each shift register stage, the first and second transistors "$T_1$" and "$T_2$" are connected to each other in series and are connected to Q and Qb terminals of the corresponding shift register unit "SRU1," "SRU2", "SRU3" or "SRU4". A plurality of output signals "Vg1," "Vg2", "Vg3" and "Vg4" are sequentially output from connection portions of the first and second transistors "$T_1$" and "$T_2$" to a plurality of gate lines "g1," "g2", "g3" and "g4", respectively. Each of the gate signals "Vg1," "Vg2", "Vg3" and "Vg4" is input to the next shift register stage. Further, each of the gate signals "Vg3", "Vg4", "Vg5" and "Vg6" is input to the shift register stage immediately preceding the previous shift register stage. In other words, "Vg3" is input to SRS1; "Vg4" is input to SRS2; "Vg5" is input to SRS3; and "Vg6" is input to SRS4. The AND operators "A1" and "A2" receive both the previous gate voltage (or a start signal "start") and the gate voltage of the shift register stage immediately following the next shift register stage, as illustrated in FIG. 9. The first and second AND operators "A1" and "A2" output first and second AND operated signals to set and reset terminals "S" and "R" of the corresponding shift register unit "SRU1," "SRU2", "SRU3" or "SRU4". While the first AND operator "A1" has two non-inversion input terminals for receiving the previous gate voltage and the gate voltage of the shift register stage immediately following the next shift register stage, the second AND operator "A2" has a non-inversion input terminal for receiving the gate voltage of the shift register stage immediately following the next shift register stage, and an inversion input terminal for receiving the previous gate voltage (or the start signal "start"), as illustrated in FIG. 9. In a similar manner, all the components of the driving circuit are operatively coupled.

In the first shift register stage "SRS1", a first form generation clock "F1" is input to the first transistor "$T_1$" through a first form generation clock line and the second transistor "$T_2$" is connected to a source voltage terminal (or a ground terminal). In the second shift register stage "SRS2", a second form generation clock "F2" is input to the first transistor "$T_1$" through a second form generation clock line and the second transistor "$T_2$" is connected to the source voltage terminal (or the ground terminal). In the third shift register stage "SRS3" a third form generation clock "F3" is input to the first transistor "$T_1$" through a third form generation clock line and the second transistor "$T_2$" is connected to the source voltage terminal (or the ground terminal). In the fourth shift register stage "SRS4", a fourth form generation clock "F4" is input to the first transistor "$T_1$" through a fourth form generation clock line and the second transistor "$T_2$" is connected to the source voltage terminal (or the ground terminal). In this manner, the four-phase form generation clocks "F1" to "F4" are repeatedly input to the first transistors "$T_1$" of the plurality of shift register stages "SRS1," "SRS2", "SRS3" and "SRS4," respectively, through the first to fourth form generation clock lines. In other words, the first to fourth form generation clocks "F1" to "F4" are repeatedly input to the corresponding first transistors "$T_1$" per four stages. The second transistors "$T_2$" of the plurality of shift register stages "SRS1," "SRS2", "SRS3" and "SRS4" are connected to the source voltage terminal (or the ground terminal).

In each of the shift register units, gate terminals of the first and second transistors "$T_1$" and "$T_2$" are connected to the Q and Qb terminals, respectively.

A start signal and the third gate signals "Vg3" are input to the first shift register stage "SRS1." In addition, the first gate signal "Vg1" and the fourth gate signals "Vg4" are input to the second shift register stage "SRS2". In this manner, two gate signals i.e., the previous gate signal (or the start signal) and the gate signal of the shift register stage immediately following the next shift register are input to the corresponding shift register stage "SRS1," "SRS2", "SRS3" or "SRS4". In particular, the start signal is input to the first shift register stage "SRS1" to start a frame, instead of a gate voltage.

States of the Q and Qb terminals of each of the shift register units "SRU1," "SRU2", "SRU3" and "SRU4" are determined by states of the set and reset terminals "R" and "S" such that states of the Q and Qb terminals are opposite to each other. If states of the Q and Qb terminals are set, such states remain until a state of the reset terminal "R" is changed to a high stage i.e., a logic value "1". A high state of the reset terminal "R" may be obtained when the gate signal of the shift register stage immediately following the next stage is a high state. Accordingly, the Q terminal is a high state when the previous gate signal (or the start signal) has a high state and remains such a high state until the gate signal of the shift register stage immediately following the next shift register stage is a high state, and the Qb terminal is a state opposite to a state of the Q terminal.

When the Q terminal is a high state and the Qb terminal is a low state, the first transistor "$T_1$" is turned on and the second transistor "$T_2$" is turned off. Accordingly, each of the shift register stages "SRS1," "SRS2", "SRS3" and "SRS4" outputs the corresponding form generation clock "F1", "F2", "F3" and "F4" input to the first transistor "$T_1$" to the corresponding gate line "g1," "g2", "g3" and "g4". As a result, the first to fourth form generation clocks "F1" to "F4" are sequentially output from the corresponding shift register stages "SRS1," "SRS2", "SRS3" and "SRS4". For instance, $(4n+1)^{th}$, $(4n+2)^{th}$, $(4n+3)^{th}$ and $(4n+4)^{th}$ shift register stages may output the first, second, third and fourth form generation clocks "F1", "F2", "F3" and "F4", respectively.

Figure 10:
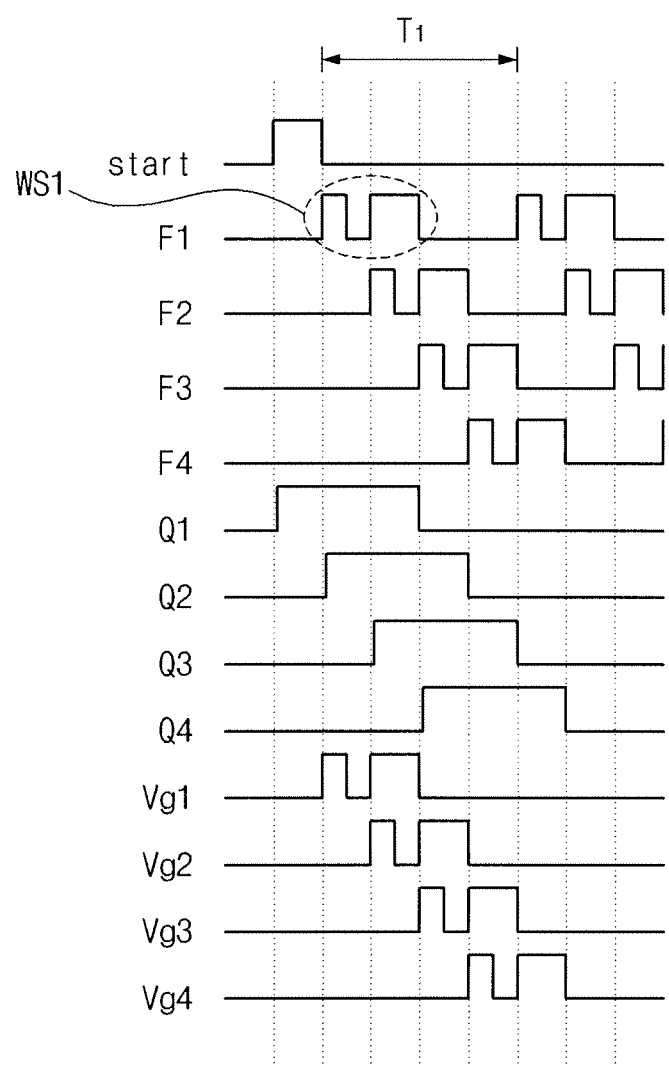
FIG. 10 is a schematic timing chart showing one example of signals input to and output from the driving circuit of FIG. 9 according to the first embodiment of the present invention.

FIG. 10 is a schematic timing chart showing one example of signals input to and output from the driving circuit of FIG. 9 according to the first embodiment of the present invention. In this example, the four-phase form generation clocks "F1" to "F4" have a shape of two separate square waves having different pulse widths, as a multiple-pulse wave shape "WS1".

As shown in FIG. 10, the high state of Q terminals of the plurality of shift register units "SRU1," "SRU2", "SRU3" and "SRU4" is shifted by the previous gate voltage and the gate voltage of the shift register stage immediately following the next shift register stage, and thus the outputs of the plurality of shift register stages "SRS1," "SRS2", "SRS3" and "SRS4" are determined by the four-phase form generation clocks "F1" to "F4". Accordingly, the driving circuit including the plurality of shift register stages can generate sequential signals having a shape different from a square wave shape. The first form generation clock "F1" partially overlaps the second form generation clock "F2". In this manner, adjacent form generation clocks "F1" to "F4" partially overlaps each other.

The first Q terminal "Q1" of the first shift register unit "SRU1" has a high state for $3 T_1/8$ ($T_1$ is a period of each form generation clock "F1", "F2", "F3" and "F4"), and the second Q terminal "Q2" of the second shift register unit "SRU2" has a high state for $3T_1/8$ shifted from the high state of the first Q terminal "Q1" by $T_1/4$. While the Q terminals of the plurality of shift register units "SRU1," "SRU2," "SRU3" and "SRU4" have a high state, the output signals "Vg1," "Vg2," "Vg3" and "Vg4" are sequentially generated and applied respectively to the plurality of gate lines "g1," "g2," "g3" and "g4."

The driving circuit including the plurality of shift register stages can generate sequential output signals having a shape of two separated square waves having different pulse widths by using the four-phase form generation clocks and the gate voltages output from the plurality of shift register stages.

Figure 11:
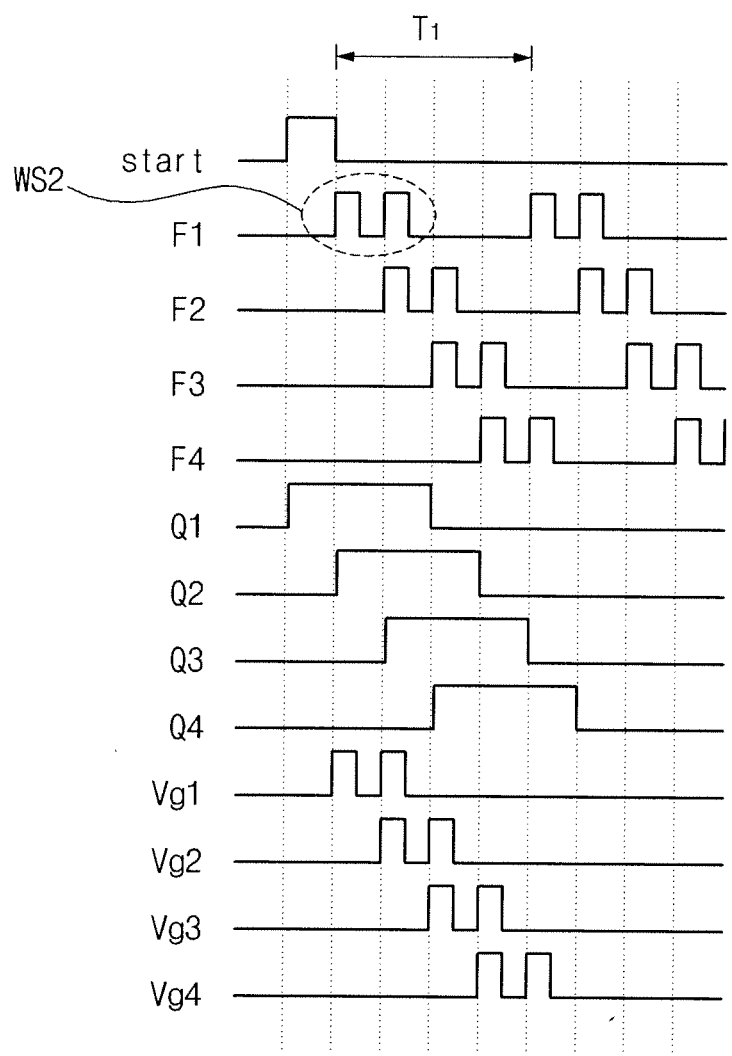
FIG. 11 is a schematic timing chart showing another example of signals input to and output from the driving circuit of FIG. 9 according to the first embodiment of the present invention.

FIG. 11 is a schematic timing chart showing another example of signals input to and output from the driving circuit of FIG. 9 according to the first embodiment of the present invention.

As shown in FIG. 11, the high state of Q terminals of the plurality of shift register units is shifted by the previous gate voltage and the gate voltage of the shift register stage immediately following the next shift register stage, and the outputs of the plurality of shift register stages are determined by the four-phase form generation clocks "F1", "F2", "F3" and "F4". The four-phase form generation clocks "F1," "F2," "F3" and "F4" have a shape "WS2" of two separated square waves having identical or equal pulse widths. Accordingly, the driving circuit including the plurality of shift register stages can generate sequential signals having a shape different from a square wave shape.

Figure 12:
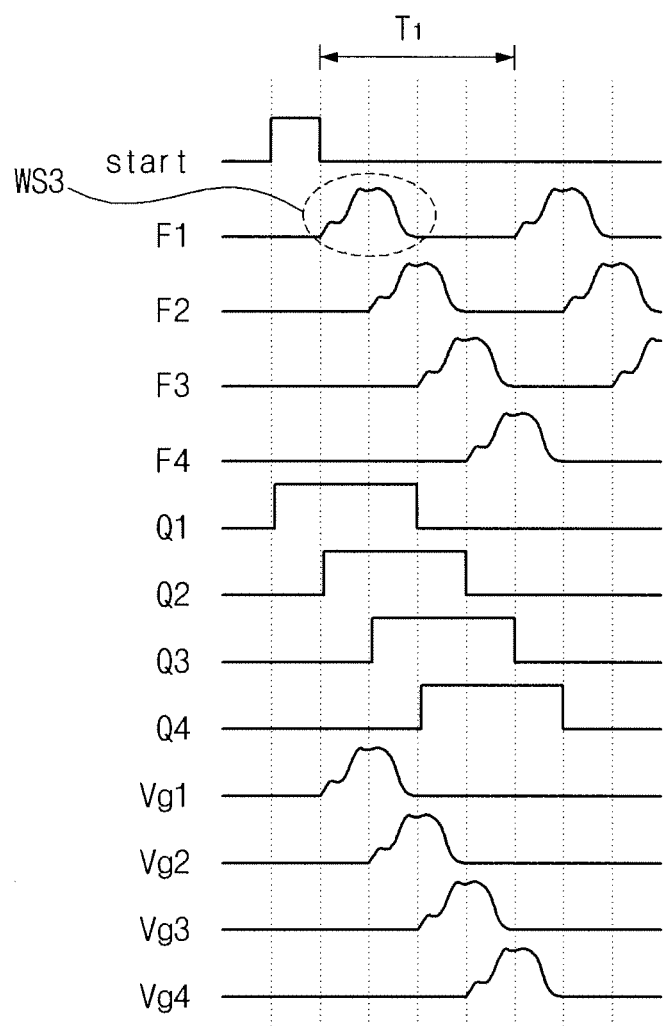
FIG. 12 is a schematic timing chart showing another example of signals input to and output from the driving circuit of FIG. 9 according to the first embodiment of the present invention.

FIG. 12 is a schematic timing chart showing another example of signals input to and output from the driving circuit of FIG. 9 according to the first embodiment of the present invention.

As shown in FIG. 12, the high state of Q terminals of the plurality of shift register units is shifted by the previous gate voltage and the gate voltage of the shift register stage immediately following the next shift register stage, and the outputs of the plurality of shift register stages are determined by the four-phase form generation clocks "F1," "F2," "F3" and "F4." The four-phase form generation clocks "F1," "F2," "F3" and "F4" have an arbitrary shape "WS3" that can be interpreted by a sum of indefinite sinusoidal waves having different amplitudes and periods.

When a shift register outputting signals having various shapes is formed in a display panel, a driving circuit including the shift register has a low reliability and stability because the shift register is complex according to the related art. In the present invention, however, the form generation clocks having various shapes can be supplied from an external circuit such as a timing controller, thereby capable of maintaining stability and reliability. In particular, as shown in FIGS. 10 to 12, the driving circuit including the plurality of shift register stages can output various signals having shapes different from each other by using the form generation clocks having various shapes different from each other. Accordingly, the output signals of the driving circuit can have a variety of shapes even after the driving circuit is formed by providing clock signals having a variety of shapes to the driving circuit. Accordingly, a fixation problem of output signal shape in the related art can be effectively solved.

Figure 13:
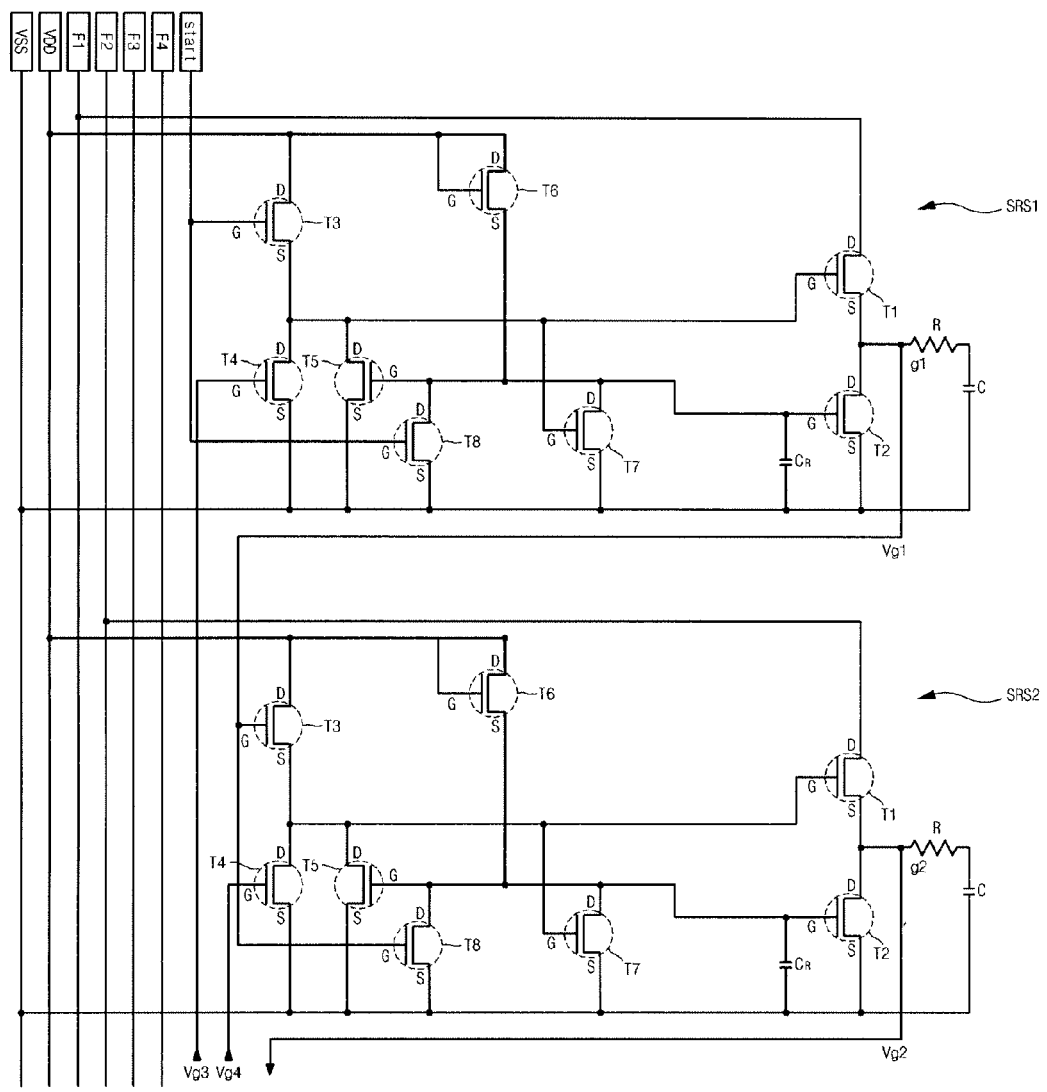
FIG. 13 is a schematic circuit diagram illustrating a shift register stage of a driving circuit of FIG. 9 according to the first embodiment of the present invention.

FIG. 13 is a schematic circuit diagram illustrating a shift register stage of a driving circuit of FIG. 9 according to the first embodiment of the present invention. The driving circuit here is formed by connecting a plurality of shift register stages having the same components in series, with these components having different connections as discussed below. For the sake of brevity, only first and second shift register stages of FIG. 9 are shown in FIG. 13.

As illustrated in FIG. 13, each of the shift register stages "SRS1" and "SRS2" using the previous gate voltage and the gate voltage of the shift register stage immediately following the next shift register stage and four-phase form generation clocks is comprised of first to eighth transistors "T1" to "T8," each having a gate terminal, a source terminal and a drain terminal.

The gate and drain terminals of the third transistor "T3" are connected to a start signal terminal "start" or input with a previous gate signal "Vg1" and a drain voltage terminal "VDD" ("VDD" is a positive voltage supply or a high state voltage supply), respectively. In particular, the start signal "start" and the first gate signal "Vg1" are input to the first and second shift register stages "SRS1" and "SRS2", respectively. In addition, the source terminal of the third transistor "T3" is connected to the drain terminals of the fourth and fifth transistors "T4" and "T5", the gate terminals of the seventh and first transistors "T7" and "T1". The gate terminal of the fourth transistor "T4" is connected to the corresponding gate voltage "Vg3" or "Vg4."

The gate terminal of the fifth transistor "T5" is connected to the drain terminals of the eighth and seventh transistors "T8" and "T7", the source terminal of the sixth transistor "T6", and the gate terminal of the second transistor "T2".

Both the gate and drain terminals of the sixth transistor "T6" are connected to the drain terminal of the third transistor "T3" (i.e. the drain voltage terminal "VDD").

The source terminals of the fourth, fifth, seventh and eighth transistors "T4", "T5" "T7" and "T8" are connected to a source voltage terminal "VSS" ("VSS" is a negative voltage supply or a ground terminal or a low state voltage supply).

The gate terminal of the fourth transistor "T4" is input to the corresponding gate signal "Vg3" or "Vg4". The gate terminal of the eighth transistor "T8" is connected to the start signal terminal "start" or input to the previous gate signal "Vg1".

The drain terminal of the first transistor "T1" is connected to a corresponding form generation clock terminal "F1" or "F2". The source terminal of the first transistor "T1" is connected to the drain terminal of the second transistor "T2". The source terminal of the second transistor "T2" is connected to the source voltage terminal "VSS".

A register capacitor $C_R$ is connected to both the gate and source terminals of the second transistor "T2".

The first and second shift register stages "SRS1" and "SRS2" of FIG. 13 are input with the corresponding generation clocks i.e., first and second form generation clocks "F1" and "F2". The third and fourth form generation clocks "F3" and "F4" are input to the corresponding shift register stages i.e., the third and fourth shift register stages "SRS3" and "SRS4" of FIG. 9. In other words, the first to fourth generation clocks "F1" to "F4" are input repeatedly to the corresponding shift register stages.

Figure 14:
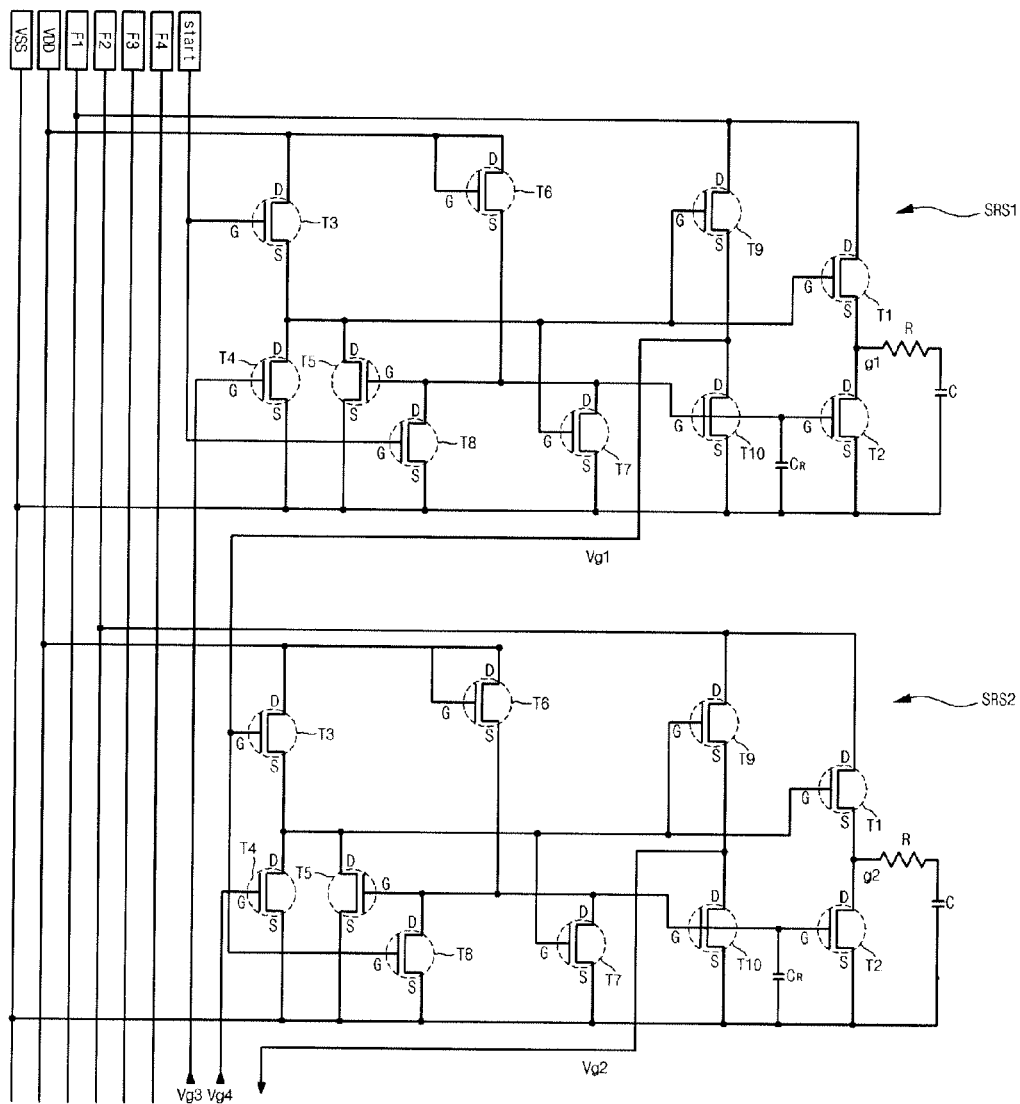
FIG. 14 is a schematic circuit diagram illustrating another example of a shift register stage of a driving circuit of FIG. 9 according to the first embodiment of the present invention.

FIG. 14 is a schematic circuit diagram illustrating another example of shift register stage of a driving circuit of FIG. 9 according to the first embodiment of the present invention.

As illustrated in FIG. 14, the construction of the shift register stage of FIG. 14 is similar to that of FIG. 13, except for adding ninth and tenth transistors "T9" and "T10". In other words, the first to eighth transistors "T1" to "T8" of each shift register stage "SRS1" or "SRS2" of FIG. 14 have the same interconnection relations as those of FIG. 13. Each shift register stage "SRS1" or "SRS2" of FIG. 14 further have the ninth and tenth transistors "T9" and "T10".

The ninth and tenth transistors "T9" and "T10" have interconnection relations corresponding to the first and second transistors "T1" and "T2", respectively. In other words, the drain terminal of the ninth transistor "T9" is connected to a corresponding form generation clock terminal "F1" or "F2". The source terminal of the ninth transistor "T9" is connected to the drain terminal of the tenth transistor "T10". The gate terminal of the ninth transistor "T9" is connected to the source terminal of the third transistor "T3". The source terminal of the tenth transistor "T10" is connected to the source voltage terminal "VSS". The gate terminal of the tenth transistor "T10" is connected to the gate terminal of the fifth transistor "T5".

In each shift register stage "SRS1" or "SRS2" of FIG. 14, the ninth and tenth transistors "T9" and "T10" are used to output each gate voltage "Vg1" or "Vg2" to the next shift register stage, and the first and second transistors "T1" and "T2" are used to output each gate voltage "Vg1" or "Vg2" to the corresponding gate line "g1" or "g2". In other words, the shift register stages of FIGS. 13 and 14 are different in that the shift register stage of FIG. 14 further have the two transistors "T9" and "T10" outputting the gate voltage to the next shift register stage. However, the shift register stages of FIGS. 13 and 14 operate in a substantially same manner. Accordingly, it should be understood that the shift register stage of FIG. 9 may further have the two transistors "T9" and "T10" of FIG. 14 connected in parallel to the first and second transistors "T1" and "T2" and connected to Q and Qb terminals, respectively.

Figure 15:
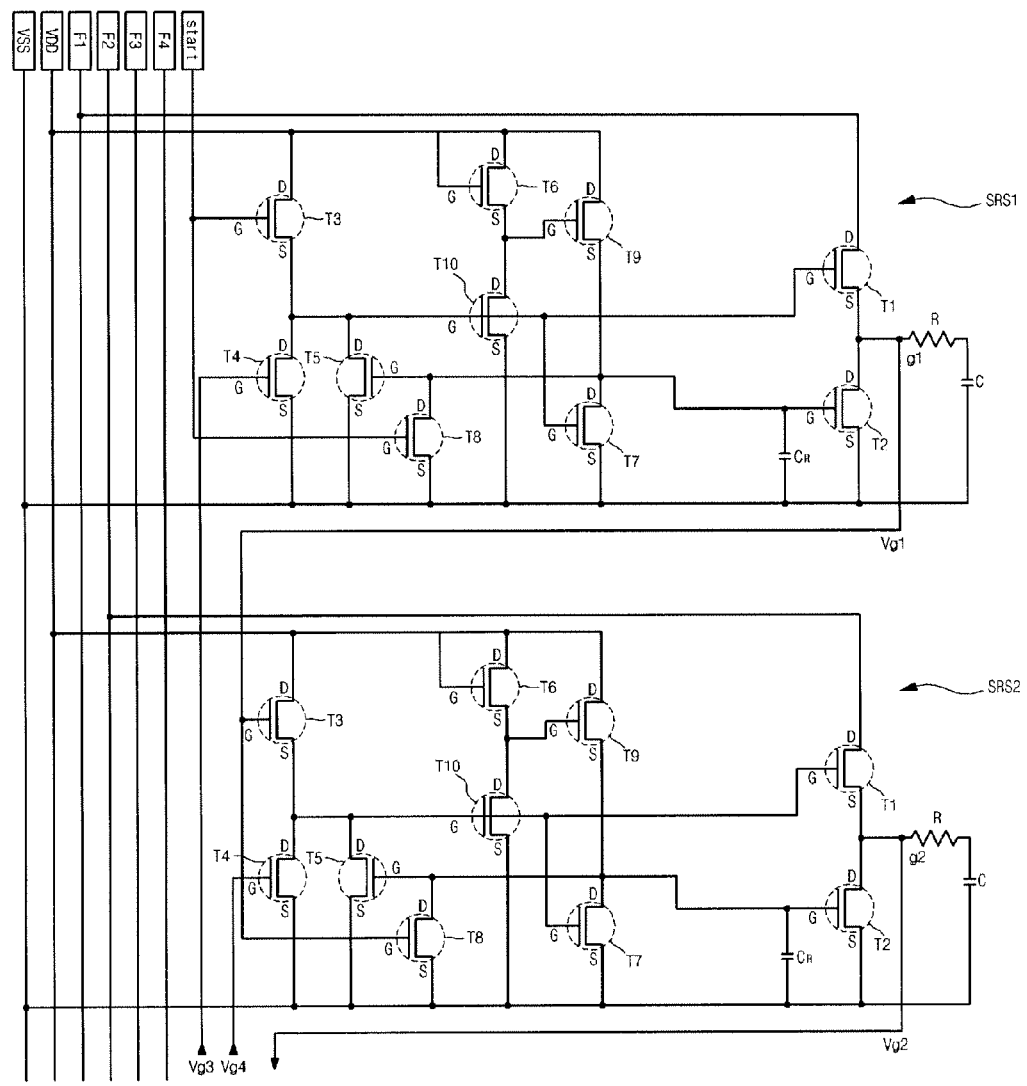
FIG. 15 is a schematic circuit diagram illustrating another example of a shift register stage of a driving circuit of FIG. 9 according to the first embodiment of the present invention.

FIG. 15 is a schematic circuit diagram illustrating another example of a shift register stage of a driving circuit of FIG. 9 according to the first embodiment of the present invention.

As illustrated in FIG. 15, the construction of the shift register stage of FIG. 15 is similar to that of FIG. 13, except for adding ninth and tenth transistors "T9" and "T10". In other words, the first to eighth transistors "T1" to "T8" of each shift register stage "SRS1" or "SRS2" of FIG. 15 have the same interconnection relations as those of FIG. 13. Each shift register stage "SRS1" or "SRS2" of FIG. 15 further have ninth and tenth transistors "T9" and "T10".

The drain terminal of the ninth transistor "T9" is connected to the drain terminal of the sixth transistor "T6" (i.e., the drain voltage terminal "VDD"). The source terminal of the ninth transistor "T9" is connected to the drain terminal of the seventh transistor "T7". The gate terminal of the ninth transistor "T9" is connected to the source terminal of the sixth transistor "T6". The source terminal of the sixth transistor "T6" is connected to the drain terminal of the tenth transistor "T10", not to the gate terminal of the fifth transistor "T5" unlike that of FIG. 13. The gate terminal of the tenth transistor "T10" is connected to the source terminal of the third transistor "T3". The source terminal of the tenth transistor "T10" is connected to the source voltage terminal "VSS".

In each shift register stage "SRS1" or "SRS2" of FIG. 15, the first and second transistors "T1" and "T2" are used to output each gate voltage "Vg1" or "Vg2" to the corresponding gate line "g1" or "g2" as well as the corresponding next shift register in a similar manner explained with reference to FIG. 13.

Figure 16:
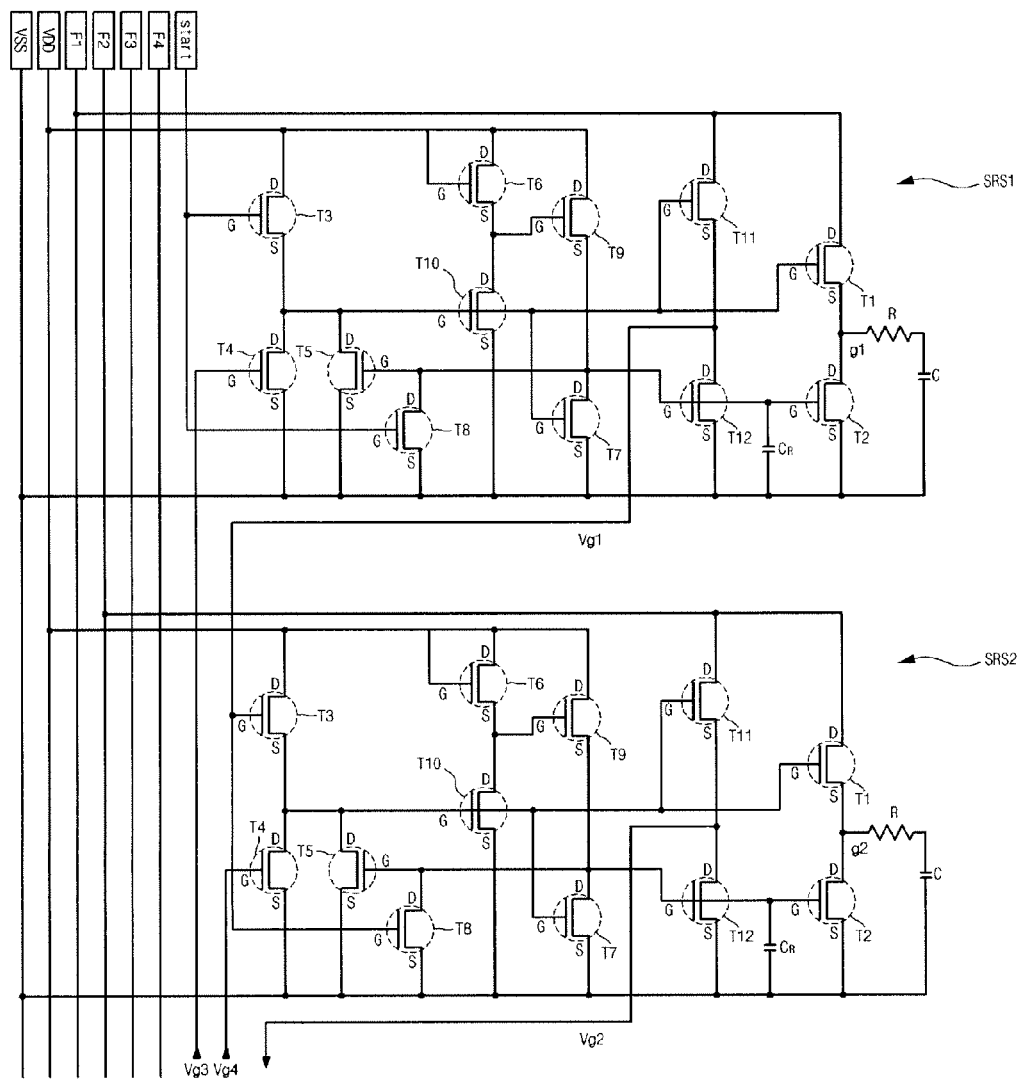
FIG. 16 is a schematic circuit diagram illustrating another example of a shift register stage of a driving circuit of FIG. 9 according to the first embodiment of the present invention.

FIG. 16 is a schematic circuit diagram illustrating another example of a shift register stage of a driving circuit of FIG. 9 according to the first embodiment of the present invention.

As illustrated in FIG. 16, the construction of the shift register stage of FIG. 16 is similar to that of FIG. 15, except for adding eleventh and twelfth transistors "T11" and "T12". Further, the eleventh and twelfth transistors "T11" and "T12" of FIG. 16 have the same interconnection relations as the ninth and tenth transistor of FIG. 14. In other words, the eleventh and twelfth transistors "T11" and "T12" are connected in parallel to the first and second transistors "T1" and "T2" and are used to output each gate voltage "Vg1" or "Vg2" to the next shift register stage. Accordingly, the shift register stages of FIGS. 15 and 16 are different in that the shift register stage of FIG. 16 further have the two transistors "T11" and "T12" outputting the gate voltage to the next shift register stage, however, the shift register stages of FIGS. 15 and 16 operate in a substantially same manner. Therefore, it should be understood that the shift register stage of FIG. 9 may further have the two transistors "T11" and "T12" of FIG. 16 connected in parallel to the first and second transistors "T1" and "T2" and connected to Q and Qb terminals, respectively.

Figure 17:
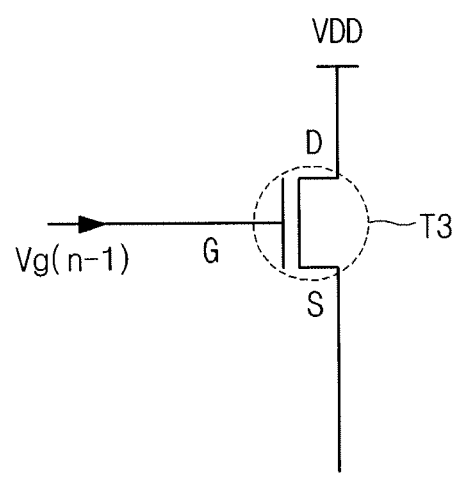
FIG. 17 is a schematic circuit diagram illustrating interconnection relations of the third transistor of FIGS. 13 to 16.
Figure 18:
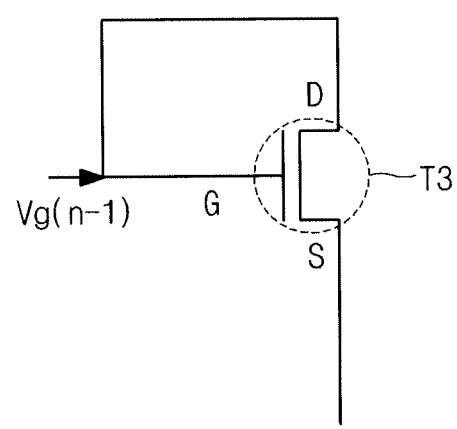
FIG. 18 is a schematic circuit diagram illustrating interconnection relations of a third transistor having the same function as the third transistor of FIG. 17.

FIG. 17 is a schematic circuit diagram illustrating interconnection relations of the third transistor of FIGS. 13 to 16, and FIG. 18 is a schematic circuit diagram illustrating interconnection relations of a third transistor having the same function as the third transistor of FIG. 17. In FIGS. 17 and 18, the third transistor T3 is formed in, for example, an $n^{th}$ shift register stage, where n is an integer and greater than one.

As illustrated in FIG. 17, a $(n-1)^{th}$ gate signal Vg(n-1) of the previous shift register stage, where Vg(n-1) is a start signal if n is 1, is input to a gate terminal of the third transistor "T3", and a drain terminal of the third transistor "T3" is connected to a source drain voltage terminal "VDD".

As illustrated in FIG. 18, the $(n-1)^{th}$ gate signal Vg(n-1) is input to both gate and drain terminals of the third transistor "T3", thereby the third transistor "T3" operating in accordance with the third transistor of FIG. 17. In other words, because both the third transistors "T3" of FIGS. 17 and 18 are turned on or off depending upon the $(n-1)^{th}$ gate signal Vg(n-1), the third transistor "T3" of FIG. 18 can operate in accordance with the third transistor of FIG. 17.

Figure 19:
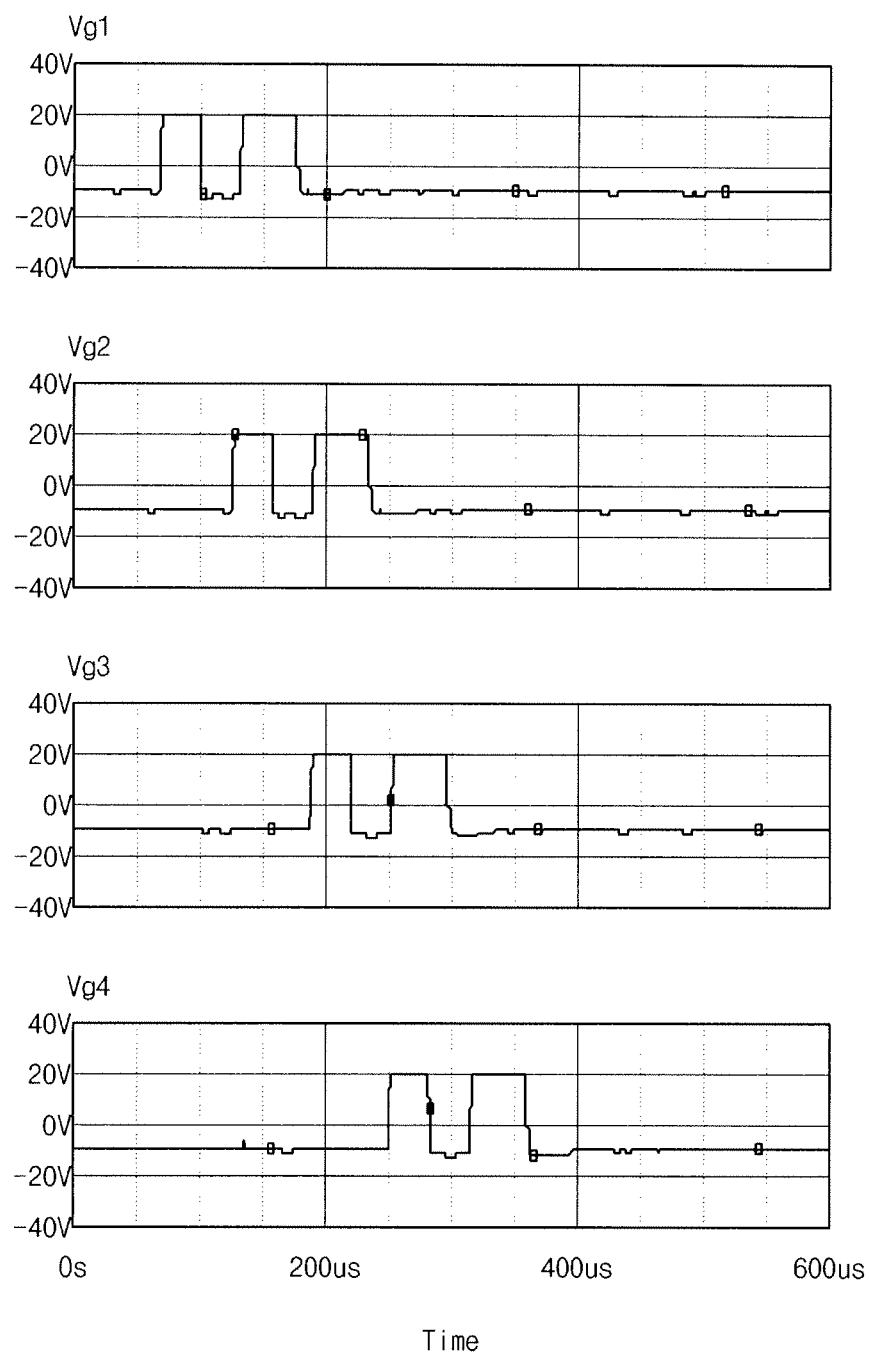
FIG. 19 is a graph showing simulated output signals of the driving circuit of FIG. 9 using the start signal and the four-phase form generation clocks of FIG. 10.

FIG. 19 is a graph showing simulated output signals of the driving circuit of FIG. 9 using the start signal and the four-phase form generation clocks of FIG. 10. As shown in FIG. 19, the simulated output signals are substantially the same as the first to fourth gate output signals "Vg1" to "Vg4" of FIG. 13.

Figure 20:
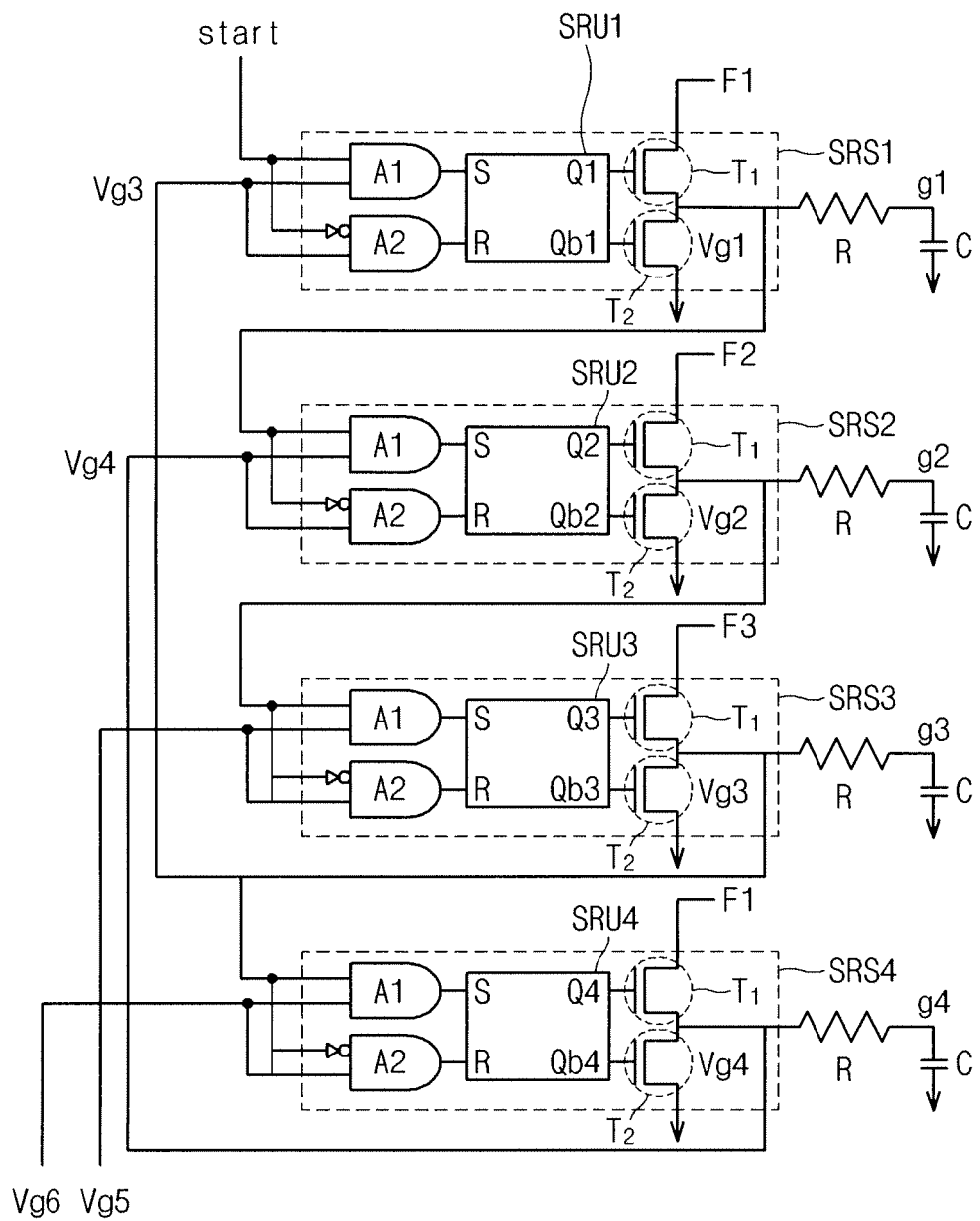
FIG. 20 is a schematic circuit diagram illustrating a driving circuit in a display panel for a flat panel display device according to a second embodiment of the present invention.

FIG. 20 is a schematic circuit diagram illustrating a driving circuit in a display panel for a flat panel display device according to a second embodiment of the present invention. The driving circuit of the second embodiment is similar to the driving circuit of the first embodiment, except for the number of form generation clocks. Accordingly, detailed explanations of parts similar to parts of the first embodiment will be omitted.

As illustrated in FIG. 20, the driving circuit includes the same plurality of shift register stages "SRS1", "SRS2", "SRS3" and "SRS4" as the driving circuit of FIG. 9. The plurality of shift register stages "SRS1," "SRS2", "SRS3" and "SRS4" of FIG. 20 are input with three-phase form generation clocks "F1" to "F3", instead of the four-phase form generation clocks "F1" to "F4" of FIG. 9. Accordingly, the three-phase form generation clocks "F1" to "F3" are repeatedly input to the plurality of shift register stages "SRS1", "SRS2", "SRS3" and "SRS4" per three stages. For example, the first, second and third form generation clocks "F1", "F2" and "F3" are input to the first, second and third shift register stages "SRS1", "SRS2" and "SRS3" and the first form generation clock "F1" is repeatedly input to the fourth shift register stage "SRS4" such that the three-phase form generation clocks "F1" to "F3" are repeatedly input to the plurality of shift register stages of the driving circuit.

Each of the shift register stages "SRS1", "SRS2", "SRS3" and "SRS4" includes a shift register unit "SRU1," "SRU2", "SRU3" or "SRU4", a first transistor "$T_1$" and a second transistor "$T_2$", and a first AND operator "A1" and a second AND operator "A2". An RS flip-flop circuit is used for the shift register units "SRU1," "SRU2", "SRU3" and "SRU4", and an AND gate circuit is used for the first and second operators "A1" and "A2". Each of the shift register stages "SRS1," "SRS2", "SRS3" and "SRS4" is connected to the corresponding gate line "g1", "g2", "g3" or "g4". An array resistor R and an array capacitor C connected to each of the gate lines "g1", "g2", "g3" and "g4" represent, respectively, a resistance and a capacitance of each of the gate lines "g1", "g2", "g3" and "g4" and a plurality of array pixels connected to the corresponding gate line "g1", "g2", "g3" and "g4".

For each shift register stage, the first and second transistors "$T_1$" and "$T_2$" are connected to each other in series and are connected to Q and Qb terminals of the corresponding shift register unit "SRU1," "SRU2", "SRU3" or "SRU4". A plurality of output signals "Vg1," "Vg2", "Vg3" and "Vg4" are sequentially output from a node between the first and second transistors "$T_1$" and "$T_2$" to a plurality of gate lines "g1," "g2", "g3" and "g4", respectively. Each of the gate signals "Vg1," "Vg2", "Vg3" and "Vg4" is input to the next shift register stage. Further, each of the gate signals "Vg3", "Vg4", "Vg5" and "Vg6" is input to the shift register stage immediately preceding the previous shift register stage. The AND operators "A1" and "A2" receive both the previous gate voltage (or a start signal "start") and the gate voltage of the shift register stage immediately following the next shift register stage. The first and second AND operators "A1" and "A2" output first and second AND operated signals to set and reset terminals "S" and "R" of the corresponding shift register unit "SRU1," "SRU2", "SRU3" or "SRU4". While the first AND operator "A1" has two non-inversion input terminals for receiving the previous gate voltage and the gate voltage of the shift register stage immediately following the next shift register stage, the second AND operator "A2" has a non-inversion input terminal for receiving the gate voltage of the shift register stage immediately following the next shift register stage, and an inversion input terminal for receiving the previous gate voltage (or the start signal "start"). In a similar manner, all the components of the driving circuit are operatively coupled.

As above explained, the shift register stage of the second embodiment includes the same components as the shift register stage of the first embodiment, except for the number of the form generation clocks.

Figure 21:
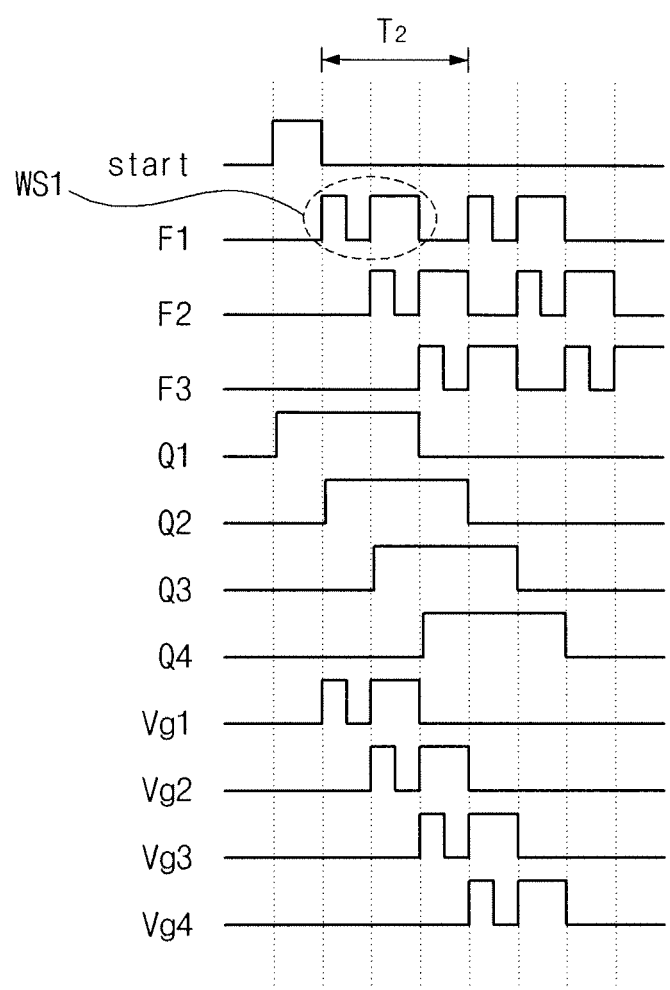
FIGS. 21 to 23 are schematic timing charts showing three examples of signals input to and output from the driving circuit of FIG. 20 according to the second embodiment of the present invention.
Figure 22:
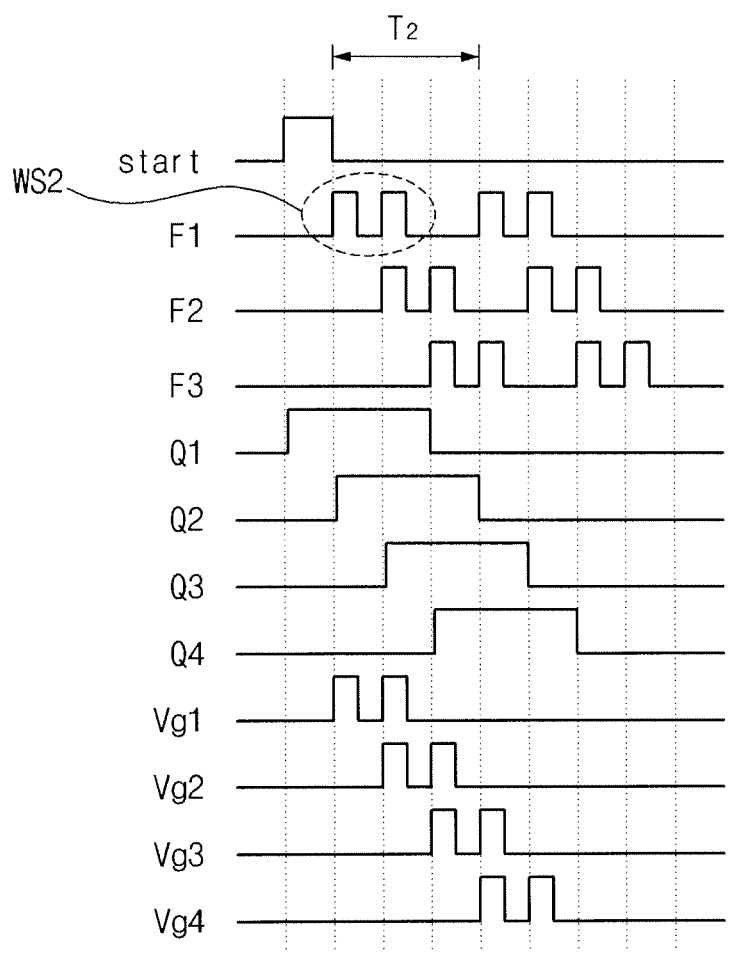
Figure 23:
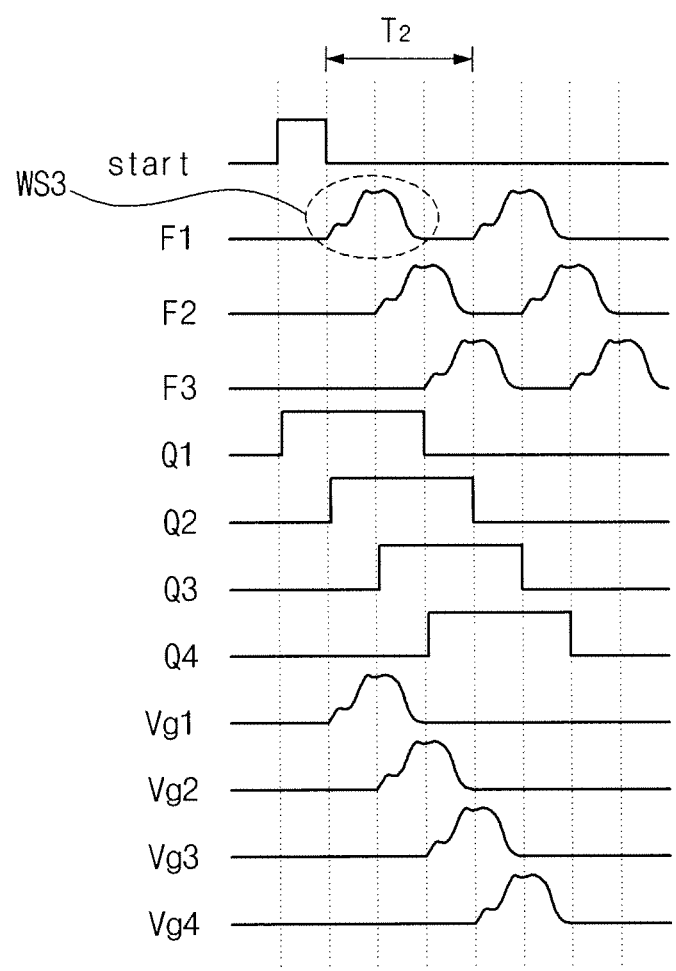
Figure 24:
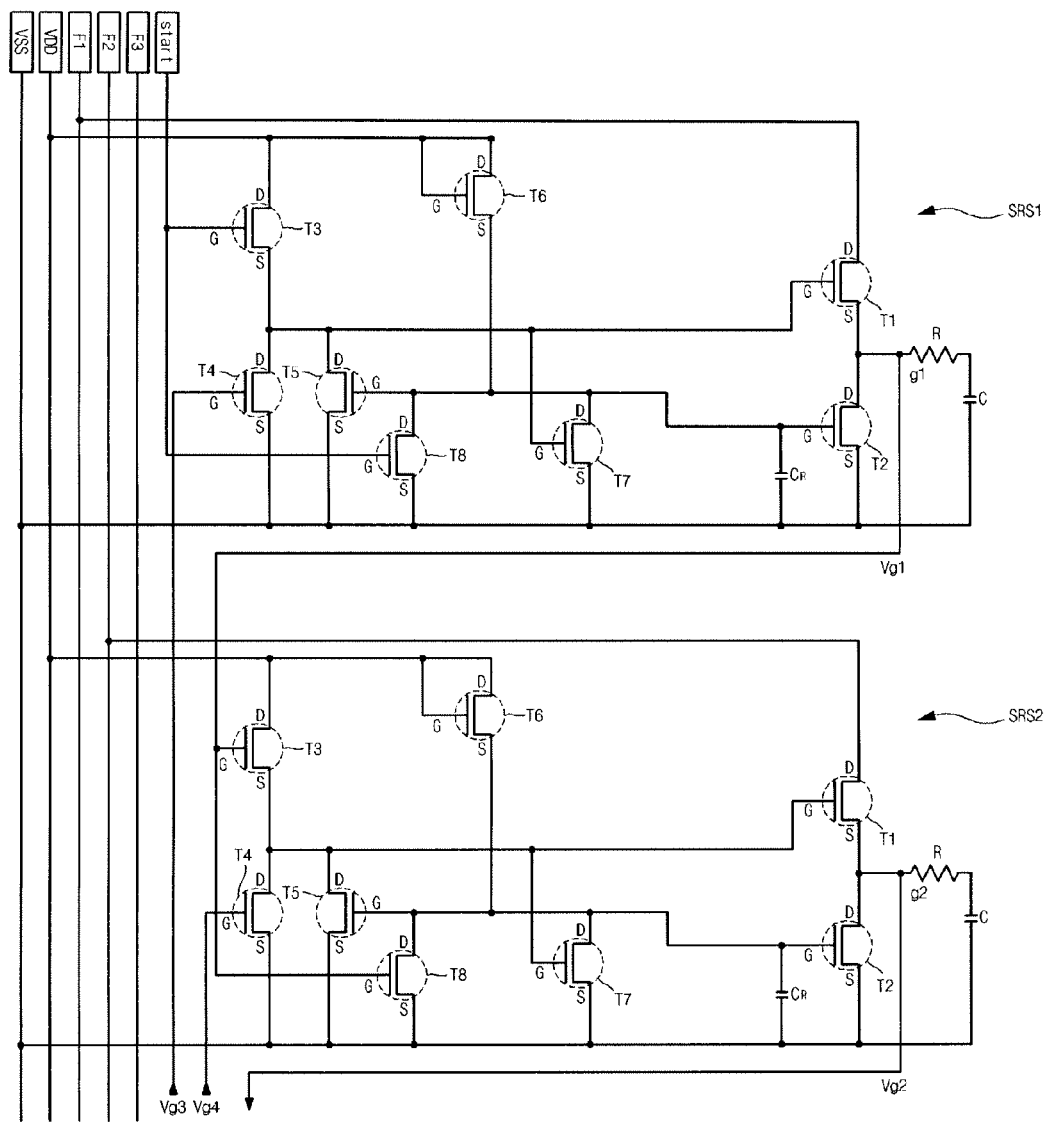
FIGS. 24 to 27 are schematic circuit diagrams illustrating four examples of a shift register stage of a driving circuit of FIG. 20 according to the second embodiment of the present invention.
Figure 25:
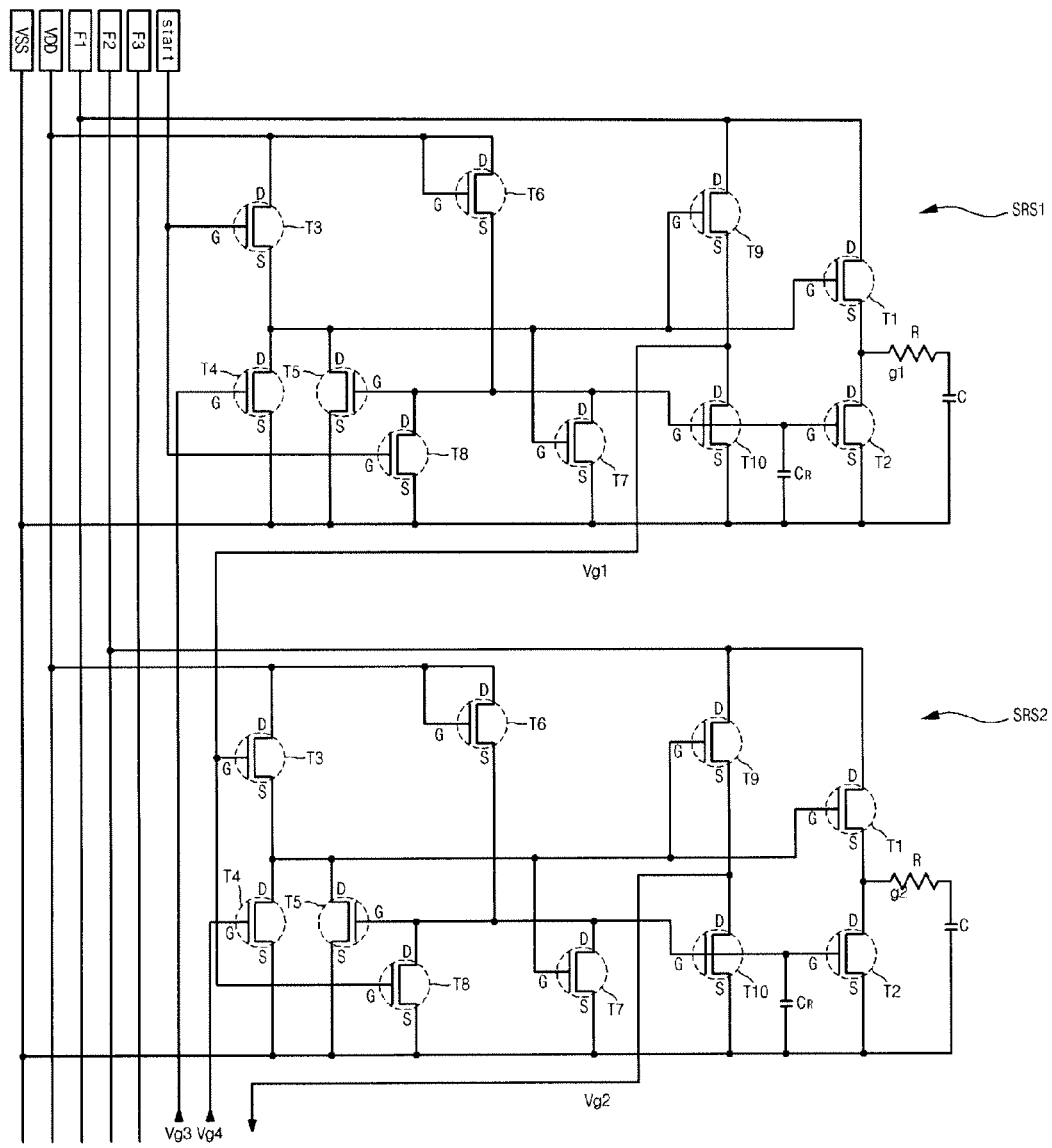
Figure 26:
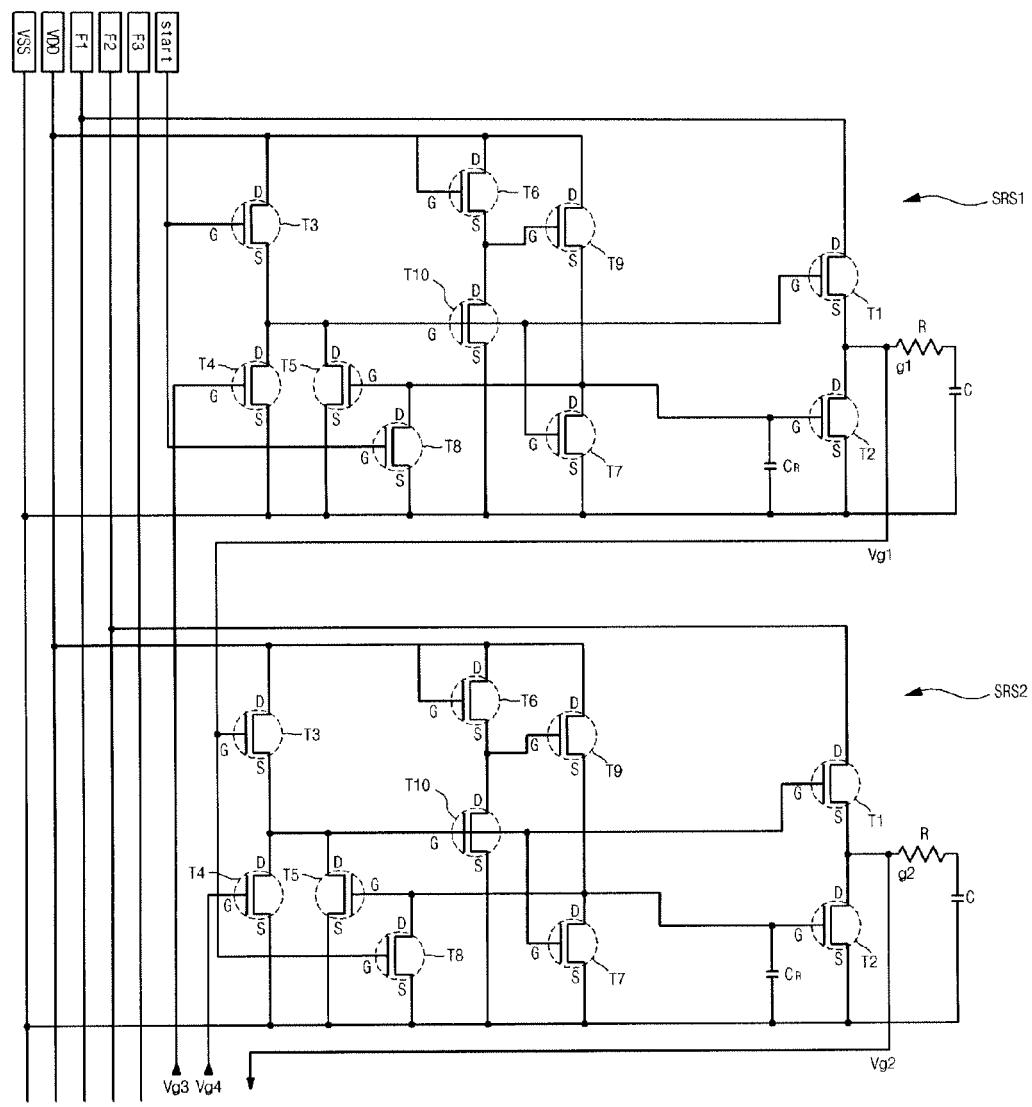
Figure 27:
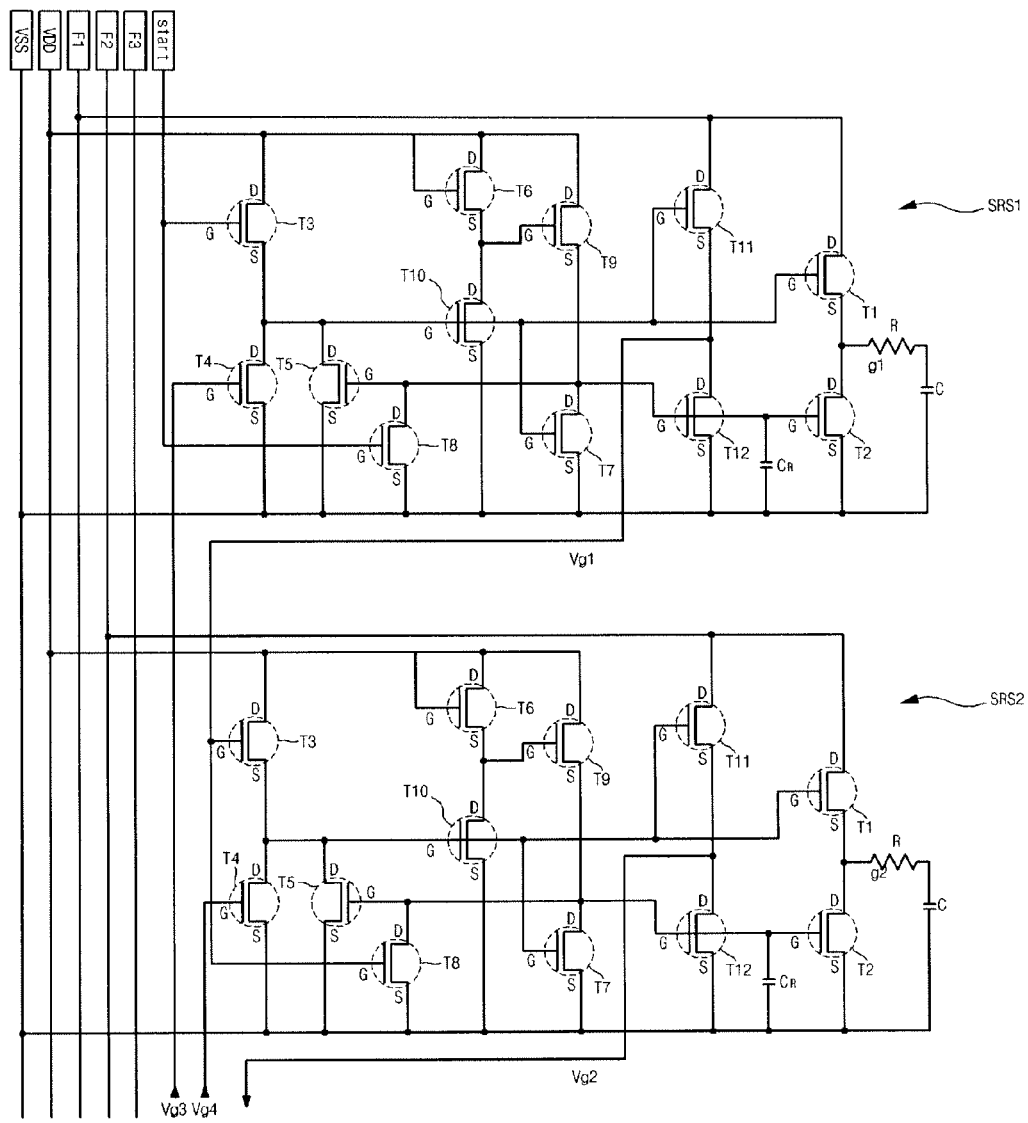

FIGS. 21 to 23 are schematic timing charts showing three examples of signals input to and output from the driving circuit of FIG. 20 according to the second embodiment of the present invention.

As shown in FIGS. 21 to 23, three-phase form generation clocks "F1" to "F3" have wave shapes "WS1" to "WS3" corresponding to the four-phase form generation clocks of FIGS. 10 to 12, respectively, except for a period of the form generation clock. In other words, because the three-phase form generation clocks "F1" to "F3" are input to the corresponding shift register stages, the period "$T_2$" of the three-phase form generation clocks "F1" to "F3" is less than the period "$T_1$" of the four-phase form generation clocks. In these examples, the period "$T_2$" is equal to ¾"$T_1$". The output signals of the driving circuit can have a variety of shapes even after the driving circuit is formed by providing clock signals having a variety of shapes to the driving circuit. Accordingly, a fixation problem of output signal shape in the related art can be effectively solved.

FIGS. 24 to 27 are schematic circuit diagrams illustrating four examples of a shift register stage of a driving circuit of FIG. 20 according to the second embodiment of the present invention.

As illustrated in FIGS. 24 to 27, interconnection relations of transistors in each shift register stage are in accord with interconnection relations of transistors in each shift register stage of FIGS. 13 to 16, respectively, except for connecting form generation clocks to the corresponding shift register stage. In other words, because the three-phase form generation clocks "F1" to "F3" are input to the corresponding shift register stages per three stages, the first transistor "T1" of each shift register stage is connected to the corresponding form generation clock "F1", "F2" or "F3". Each shift register stage "SRS1" or "SRS2" of FIGS. 24 to 27 have eight transistors "T1" to "T8", ten transistors "T1" to "T10", ten transistors "T1" to "T10" and twelve transistors "T1" to "T12" in accordance with each shift register stage of FIGS. 13 to 17, respectively.

Consequently, a driving circuit including a plurality of shift register stages for a flat panel display device according to the present invention can sequentially generate output signals having various shapes even after the driving circuit is formed, and can perform many functions. In addition, because a large number of transistors are not required in the present invention, reliability and stability of the driving circuit can be improved.

In the embodiments explained above, the driving circuit uses three-phase or four-phase form generation clocks. However, it should be understood that the driving circuit may use n-phase form generation clocks, and that the n-phase form generation clocks may be shifted by T/n when the n-phase form generation clocks has a period "T" similarly to the three or four-phase form generation clocks.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A driving circuit for a flat panel display device, comprising:
   a generation unit for generating n-phase form generation clocks;
   a drain voltage terminal and a source voltage terminal; and
   a plurality of shift register stages for sequentially generating a plurality of gate signals to a plurality of gate lines using the n-phase form generation clocks, one of the shift register stages including:
   first and second output terminals for outputting first and second switching signals, respectively, using an output signal of one of the preceding shift register stages and an output signal of one of the subsequent shift register stages;

a first transistor connected to the first output terminal for receiving one of the n-phase form generation clocks; and a second transistor connected to the second output terminal and the first transistor;

third to at least eighth transistors, each transistor having gate, drain and source terminals; and ninth and tenth transistors, wherein a source of the ninth transistor and a drain of the tenth transistor are connected to a node between the ninth and tenth transistors, wherein the node between the ninth and tenth transistors is directly connected to one of the subsequent shift register stages, wherein a gate of the ninth transistor is connected to a gate of the first transistor, wherein each gate line is connected to a node between the first and second transistors, and wherein each of the n-phase form generation clocks has one of a shape of two separate square waves having different pulse widths, a shape of two separated square waves having identical or equal pulse widths and a shape of a sum of indefinite sinusoidal waves having different amplitudes and periods.

2. The driving circuit of claim 1, wherein said one of the shift register stages further includes a shift register unit including the first and second output terminals and first and second input terminals respectively for receiving set and reset signals, the set and reset signals generated using the output signals of the one of the preceding shift register stages and the one of the subsequent shift register stages.

3. The driving circuit of claim 2, wherein said one of the shift register stages further includes a first AND operator including third and fourth input terminals and a second AND operator including fifth and sixth input terminals, the third and fifth input terminal for receiving the output signal of the one of the preceding shift register stages, the fourth input terminal for receiving the output signal of the one of the subsequent shift register stages, and the sixth input terminal for receiving the inverted output signal of the one of the subsequent shift register stages.

4. The driving circuit of claim 2, wherein the shift register unit includes a RS flip-flop.

5. The driving circuit of claim 3, wherein each of the first and second AND operators includes an AND gate circuit.

6. The driving circuit of claim 1, wherein the one of the preceding shift register stages is the shift register stage immediately preceding said one of the shift register stage, and the one of the subsequent shift register stages is the shift register stage immediately following the next shift register stage.

7. The driving circuit of claim 6, wherein the n-phase is one of three and four-phases.

8. The driving circuit of claim 1, wherein the plurality of shift register stages receive the n-phase form generation clocks repeatedly per n stages.

9. The driving circuit of claim 8, wherein the n-phase form generation clocks are shifted by an interval, and have a period of n times the interval.

10. The driving circuit of claim 1, wherein the drain terminal of the ninth transistor receives one of the n-phase form generation clocks and the source terminal of the ninth transistor is connected to the drain terminal of the tenth transistor; and the source terminal of the tenth transistor is connected to the source voltage terminal.

11. A driving circuit for a flat panel display device, comprising:

a generation unit for generating n-phase form generation clocks;

a drain voltage terminal and a source voltage terminal; and a plurality of shift register stages for sequentially generating a plurality of gate signals to a plurality of gate lines using the n-phase form generation clocks, one of the shift register stages including:

first and second output terminals for outputting first and second switching signals, respectively, using an output signal of one of the preceding shift register stages and an output signal of one of the subsequent shift register stages;

a first transistor connected to the first output terminal for receiving one of the n-phase form generation clocks;

a second transistor connected to the second output terminal and the first transistor;

third to at least eighth transistors, each transistor having gate, drain and source terminals; and ninth to twelfth transistors, wherein a source of the eleventh transistor and a drain of the twelfth transistor are connected to a node between the eleventh and twelfth transistors, wherein the node between the eleventh and twelfth transistors is directly connected to one of the subsequent shift register stages, wherein a gate of the eleventh transistor is connected to a gate of the first transistor, wherein each gate line is connected to a node between the first and second transistors, and wherein each of the n-phase form generation clocks has one of a shape of two separate square waves having different pulse widths, a shape of two separated square waves having identical or equal pulse widths and a shape of a sum of indefinite sinusoidal waves having different amplitudes and periods.

12. The driving circuit of claim 11, wherein the drain terminal of the first transistor receives one of the n-phase form generation clocks, and the source terminal of the first transistor is connected to the drain terminal of the second transistor;

the source terminal of the second transistor is connected to the source voltage terminal;

the gate terminal of the third transistor receives the output signal of the one of the preceding shift register stages, the drain terminal of the third transistor is connected to the drain voltage terminal, and the source terminal of the third transistor is connected to the drain terminals of the fourth and fifth transistors and the gate terminals of the seventh and first transistors;

the gate terminal of the fourth transistor receives the output signal of the one of the subsequent shift register stages, and the source terminal of the fourth transistor is connected to the source voltage terminal; and the gate terminal of the eighth transistor receives the output signal of the one of the preceding shift register stages, and the drain terminal of the eighth transistor is connected to the gate terminal of the fifth transistor.

13. The driving circuit of claim 12, wherein the gate and drain terminals of the sixth transistor are connected to the drain voltage terminal, and the source terminal of the sixth transistor is connected to the drain terminal of the tenth transistor, wherein the drain terminal of the seventh transistor is connected to the gate terminal of the fifth transistor, wherein the drain terminal of the ninth transistor is connected to the drain terminal of the sixth transistor, the gate terminal of the ninth transistor is connected to the source terminal of the sixth transistor, and the source terminal of the ninth transistor is connected to the gate terminal of the fifth transistor, wherein the gate terminal of the tenth transistor is connected to the source terminal of the third transistor, and wherein the source terminals of the fifth, seventh and tenth transistors are connected to the source voltage terminal.

14. The driving circuit of claim 13, wherein the drain terminal of the eleventh transistor receives one of the n-phase form generation clocks and the source terminal of the eleventh transistor is connected to the drain terminal of the tenth transistor; and the source terminal of the twelfth transistor is connected to the source voltage terminal.

* * * * *